(12) United States Patent
Bickel

(10) Patent No.: US 7,469,190 B2
(45) Date of Patent: Dec. 23, 2008

(54) AUTOMATED SYSTEM APPROACH TO ANALYZING HARMONIC DISTORTION IN AN ELECTRIC POWER SYSTEM

(75) Inventor: Jon A. Bickel, Murfreesboro, TN (US)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 11/726,824

(22) Filed: Mar. 23, 2007

(65) Prior Publication Data

US 2007/0179726 A1    Aug. 2, 2007

Related U.S. Application Data

(63) Continuation-in-part of application No. 11/173,743, filed on Jul. 1, 2005, now Pat. No. 7,349,815.

(51) Int. Cl.
*G01R 29/26* (2006.01)
*G06F 17/40* (2006.01)

(52) U.S. Cl. .............. 702/60; 702/58; 702/69; 700/293

(58) Field of Classification Search ........... 702/60, 702/58, 69
See application file for complete search history.

(56) References Cited

U.S. PATENT DOCUMENTS

| 5,319,513 A | * | 6/1994 | Lowenstein et al. ......... 361/113 |
| 5,587,917 A | * | 12/1996 | Elms ......................... 702/66 |
| 5,825,656 A | * | 10/1998 | Moore et al. ................. 702/60 |
| 6,005,759 A | * | 12/1999 | Hart et al. ................... 361/66 |
| 6,421,256 B1 | * | 7/2002 | Giannopoulos et al. .. 363/21.12 |
| 2007/0096680 A1 | * | 5/2007 | Schroeder et al. ........... 318/723 |

OTHER PUBLICATIONS

"Power Xpert® 4000/6000/8000 Meters," Eaton Electrical Inc., Copyright © 2001-2007; http://www.eatonelectrical.com/NASApp/cs/ContentServer?GXHC_GX_jst=c7014444662d6165&G . . . 3 pages.
"Power Xpert® 4000/6000/8000 Power Quality Meters, Product Focus," Eaton Electrical Inc., Copyright © 2007, 8 pages.
"Next-Generation Power Quality Meters," Eaton Cutler-Hammer White Paper, Eaton Corporation, dated Jan. 2006, 12 pages.
"Power XPert® 4000/6000/8000 Power Quality Meters, Technical Data," Eaton Electrical Inc., Copyright © 2007, 12 pages.
"ION 7650 Intelligent Metering And Control Device," Power Measurement © 1992-2007, http://www.pwrm.com/products/ION7650/, 2 pages.
"ION 7650 Features Summary," Power Measurement © 1992-2007, http://www.pwrm.com/products/ION7650/features/, 2 pages.

(Continued)

*Primary Examiner*—Hal D Wachsman

(57) ABSTRACT

A method and system to detect and evaluate harmonic distortion in an electrical power system is disclosed. A plurality of monitoring devices is installed in the electrical power system. The hierarchy of the electrical power system is received. Data indicative of harmonic distortion on the electrical power system is received from at least two of the monitoring devices. The data indicative of harmonic distortion is automatically aligned in a temporal or pseudo-temporal context. An electrical characteristic of the harmonic distortion from the data indicative of harmonic distortion is determined.

18 Claims, 25 Drawing Sheets

OTHER PUBLICATIONS

"ION 7650 Applications Summary," Power Measurement © 1992-2007, http://www.pwrm.com/products/ION7650/applications/, 2 pages.

"Power Quality—Where did That Event Come From?" Power Logic Solutions, Square D, vol. 7, Issue 2, © 2003, Schneider Electric, 4 pages.

"POWERLOGIC © Circuit Monitor, Series 4000T Reference Manual, Instruction Bulletin" Schneider Electric, Square D Company, 40 pages.

"PowerLogic® ION7550/ION7650 Power Energy Meters," Schneider Electric, Square D. Company, Nov. 2006, 8 pages.

"Extensive Onboard Mass Memory Securely Records All Data," The Substation Automation Solution, 1 page.

"Generic Specification For High Performance Power Monitoring, Revenue Metering, Power Quality Recording, And RTU Functionality," Nexus 1250, 10 pages.

"Performance Power Meter & Data Acquisition Node," Nexus 1250 For Industry and Utilities, Accu-Measure® Technology, Electro Industries/GaugeTech, dated May 25, 2005, 16 pages.

"EMTP-RV Computational Engine," ElectroMagnetic Transients Program/Software, 3 pages.

Bickel, Jon, Square D/Schneider Electric, "Identifying Problems From Transients In Power Systems," LaVergne, TN,—Plant Engineering, Sep. 1, 2004, 6 pages.

"Transient Power Systems (Part 1 in Transient Series)," PowerLogic Solutions, vol. 6, Issue 1, Square D/Schneider Electric, dated Sep. 2002, 4 pages.

"Transient Power Systems (Part 2 in Transient Series)," PowerLogic Solutions, vol. 6, Issue 2, Square D/Schneider Electric, dated Sep. 2002, 4 pages.

\* cited by examiner

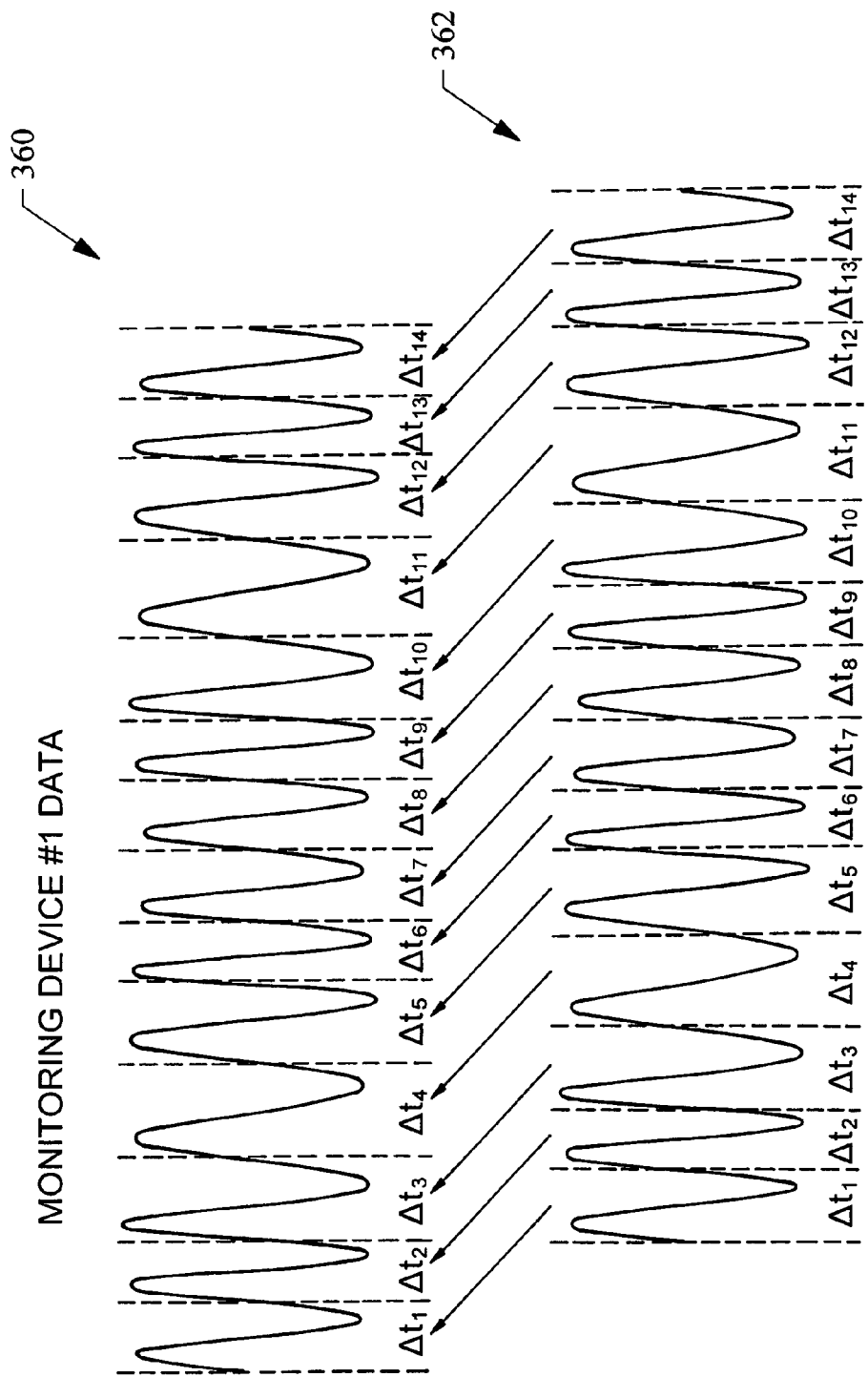

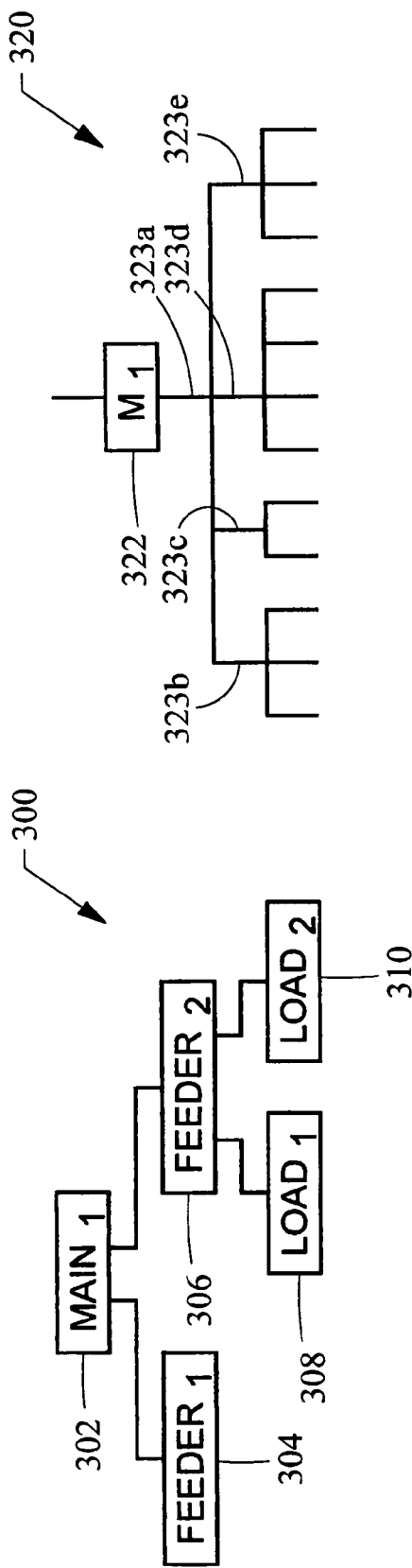
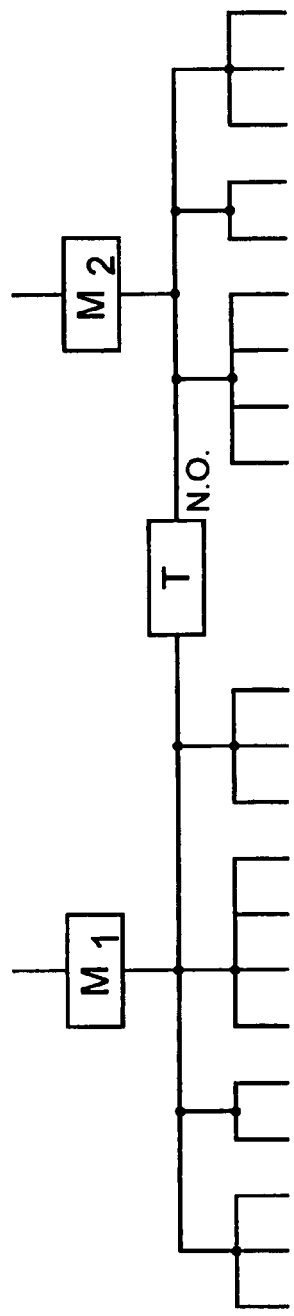
Fig. 7
Fig. 8
Fig. 6

US 7,469,190 B2

AUTOMATED SYSTEM APPROACH TO ANALYZING HARMONIC DISTORTION IN AN ELECTRIC POWER SYSTEM

RELATED APPLICATIONS

The present application is a continuation-in-part of prior U.S. patent application Ser. No. 11/173,743, now U.S. Pat. No. 7,349,815, filed Jul. 1, 2005, which is incorporated by reference in its entirety.

FIELD OF THE INVENTION

The present invention relates generally to utility monitoring systems, and, in particular, to automated analysis of harmonic distortion in a utility electrical system.

BACKGROUND OF THE INVENTION

Since the introduction of electrical power distribution systems in the late $19^{th}$ century, there has been a need to monitor their operational and electrical characteristics. The ability to collect, analyze, and respond to information about the electrical power system can improve safety, minimize equipment loss, decrease scrap, and ultimately save time and money. To that end, monitoring devices were developed to measure and report such information. With the dawn of the electronics age, the quality and quantity of data from monitoring devices was vastly improved, and communications networks and software were developed to collect, display and store information. Unfortunately, those responsible for evaluating data from monitoring devices are now overwhelmed by information from their monitoring systems. In the endeavor to maximize the usefulness of a monitoring system, monitoring equipment manufacturers are seeking methods of presenting information in the most useful format.

Effectively monitoring today's electrical power distribution systems is cumbersome, expensive, and inefficient. Electric power monitoring systems are typically arranged in a hierarchy with monitoring devices such as electrical meters installed at various levels of the hierarchy. Monitoring devices measure various characteristics of the electrical signal (e.g., voltage, current, waveform distortion, power, etc.) passing through the conductors, and the data from each monitoring device is analyzed by the user to evaluate potential performance or quality-related issues. However, the components of today's electrical monitoring systems (monitoring devices, software, etc.) act independently of each other, requiring the user to be an expert at configuring hardware, collecting and analyzing data, and determining what data is vital or useful. There are two problems here: the amount of data to be analyzed and the context of the data. These are separate but related issues. It is possible to automate the analysis of the data to address the amount of data. But, in order to do this reliably, the data must be put into context. The independence of data between each monitoring device evaluating the electrical system essentially renders each monitoring device oblivious of data from other monitoring devices connected to the system being analyzed. Accordingly, the data transmitted to the system computer from each monitoring device is often misaligned in that data from each monitoring device on the system does not arrive at the monitoring system's computer simultaneously. There are two basic reasons for the temporal misalignment of data between monitoring devices: communications time delays and monitoring device timekeeping & event time stamping. It is then up to the user to analyze and interpret this independent data in order to optimize performance or evaluate is potential quality-related concerns on the electrical system.

Sophisticated processing capabilities in digital monitoring devices allow large amounts of complex electrical data to be derived and accumulated from a seemingly simple electrical signal. Because of the data's complexity, quantity, and relative disjointed relationship from one monitoring device to the next, manual analysis of all the data is an enormous effort that often requires experts to be hired to complete the task. This process is tedious, complex, prone to error and oversight, and time-consuming. A partial solution has been to use global positioning satellite (GPS) systems to timestamp an event, but this approach requires that the user purchase and install additional hardware and data lines to link the monitoring devices together. And this solution still requires the evaluation of large amounts of data because the system is only temporally in context; not spatially in context. Synchronizing data using GPS systems is also disadvantageous because of time delays associated with other hardware in the system. Furthermore, any alignment of data by a GPS-based system can only be as accurate as the propagation delay of the GPS signal, which means that the data still may not be optimally aligned when a GPS system is used.

The addition of supplemental monitoring devices in the electrical system does nothing more than generate more information about the electrical system at the point where the meter is added in the electrical system, increasing complexity without any benefit. Any usefulness of the data is generally limited to the locality of the monitoring device that was added, while even more data is amassed.

The complexity of many electrical systems usually necessitates an involved configuration process of monitoring systems because each metered point in the electrical system has different characteristics, which is why multiple monitoring devices are installed in the first place. As a result of the enormous volume of complex data accumulated from electrical monitoring systems heretofore, a thorough analysis of the data is typically not feasible due to limited resources, time, and/or experience.

Temporal alignment of the data is one important aspect to understand and characterize the power system. Another important aspect is having a thorough knowledge of the power monitoring system's layout (or hierarchy). Power monitoring devices measure the electrical system's operating parameters, but do not provide information about how the parameters at different points on the power monitoring system relate to each other. Knowing the hierarchy of the power monitoring system puts the operating parameters of multiple monitoring devices into context with each other.

To determine the layout of a power monitoring system, a user must review electrical one-line drawings or physically perform an inventory of the electrical system if one-line drawings are unavailable. The user manually enters the spatial information into the monitoring system software for analysis. When a new device or monitored load is added or moved within the power monitoring system, the user must manually update the monitoring system software to reflect the new addition or change.

Data alignment and layout information are essential to understanding and characterizing the power system. With these two pieces of information, the data from each meter can be integrated and put into context with every other meter in the power system. Heretofore, the only techniques for passably integrating data were complex, expensive, manually intensive, and time-consuming for the user. These techniques also permit only limited integration of data and require additional hardware (such as GPS hardware), data lines, and supplemental monitoring device accessories.

A particular issue is the occurrence of harmonic distortion on an electrical system. Harmonic distortion results in many potential electrical vulnerabilities including equipment mis-operation, degradation, and potentially, failure. As more and more non-linear loads are connected to the electrical grid, issues associated with harmonic distortion will substantially increase—even in facilities that were previously not susceptible to harmonic distortion. There are various sources of harmonic distortion, most which are non-linear loads. A couple sources of harmonic distortion in an electrical power system include switch mode power supplies and silicon-controlled rectifier (SCR) controlled loads. High-impedance sources and inadequate electrical wiring can exacerbate harmonic distortion concerns. Because most loads are designed to operate most effectively at or near some designed nominal frequency, such loads may not operate as effectively when other frequencies are induced into the system. A few problems that can occur as a result of harmonic distortion include lack of phase synchronization, undervoltage circuit activation, interferences, control problems, etc.

One existing method for analyzing harmonic distortion requires measurements of the harmonic component frequencies at various points on the electrical grid. The measured data from various meters may or may not be synchronized with each other within a temporal or pseudo-temporal context. Temporal alignment is more precise than pseudo-temporal alignment. Pseudo-temporal alignment takes data within an acceptable range based on load changes in the system. However, because harmonic distortion is a steady-state phenomenon, precise temporal alignment may not be necessary. Furthermore, the measured harmonic distortion data from various meters may or may not be analyzed within a spatial context. In any case, harmonic distortion data is not currently analyzed to take advantage of both spatial and temporal or pseudo-temporal alignment of monitoring data from multiple devices, and thus limits the useful information and analysis that may be achieved. A second presently known method for performing harmonic distortion analysis of an electrical system requires purchasing a special software package that allows the user (or his/her consultant) to develop a model of the electrical system. Modeling of the electrical system requires a matrix of nodes with the corresponding impedances between the nodes. Altering the system (e.g., adding another circuit, altering the number of conductors, adding or removing components) requires that the matrix be updated to reflect the new modification. In addition, manual changes must be made to the harmonic distortion analysis software package. Such software is difficult to use and alterations are expensive and resource consuming.

What is needed, therefore, is an automated harmonic distortion analysis system for detecting and evaluating harmonic distortion in an electrical system. There is a further need for a harmonic distortion evaluation system which is easily adaptable to modifications of the electrical system. There is also a need for an integrated harmonic distortion analysis and evaluation system.

SUMMARY OF THE INVENTION

Briefly, according to one example, a method of harmonic distortion monitoring in an electrical power system is disclosed. A plurality of monitoring devices are installed in the electrical power system. The hierarchy of the electrical power system is received. Data indicative of harmonic distortion on the electrical power system is received from at least two of the plurality of monitoring devices. The data indicative of harmonic distortion is automatically aligned in a temporal or pseudo-temporal context. An electrical characteristic of the harmonic distortion from the data indicative of harmonic distortion is determined.

Another example is a system to monitor harmonic distortion in an electrical power system. The system includes a plurality of monitoring devices in the electrical power system. A central controller is coupled to the plurality of monitoring devices. The central controller receives data indicative of harmonic distortion on the electrical power system for at least some of the plurality of monitoring devices. The central controller automatically aligns the data indicative of harmonic distortion in a temporally or pseudo-temporally. The central controller also determines an electrical characteristic of the harmonic distortion from the data indicative of harmonic distortion.

Another example is a method of determining harmonic distortion on an electrical power system including a plurality of monitoring devices. The hierarchy of the electrical power system is received. Data indicative of harmonic distortion on the electrical power system from at least two of the plurality of monitoring devices is received. The data indicative of harmonic distortion is automatically aligned temporally or pseudo-temporally. The data indicative of harmonic distortion is analyzed and the analyzed data is compared to a threshold value to confirm the presence of a harmonic distortion signal.

The foregoing and additional aspects of the present invention will be apparent to those of ordinary skill in the art in view of the detailed description of various embodiments, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

FIG. 4 are exemplary frequency data samples from two monitoring devices that are aligned in accordance with the present invention;

FIG. 6 is a functional block diagram of a simplified hierarchy with a single main and two feeders;

FIG. 7 is an exemplary diagram of a single radial-fed system;

FIG. 8 is an exemplary diagram of a multiple radial-fed system;

Figure 1:
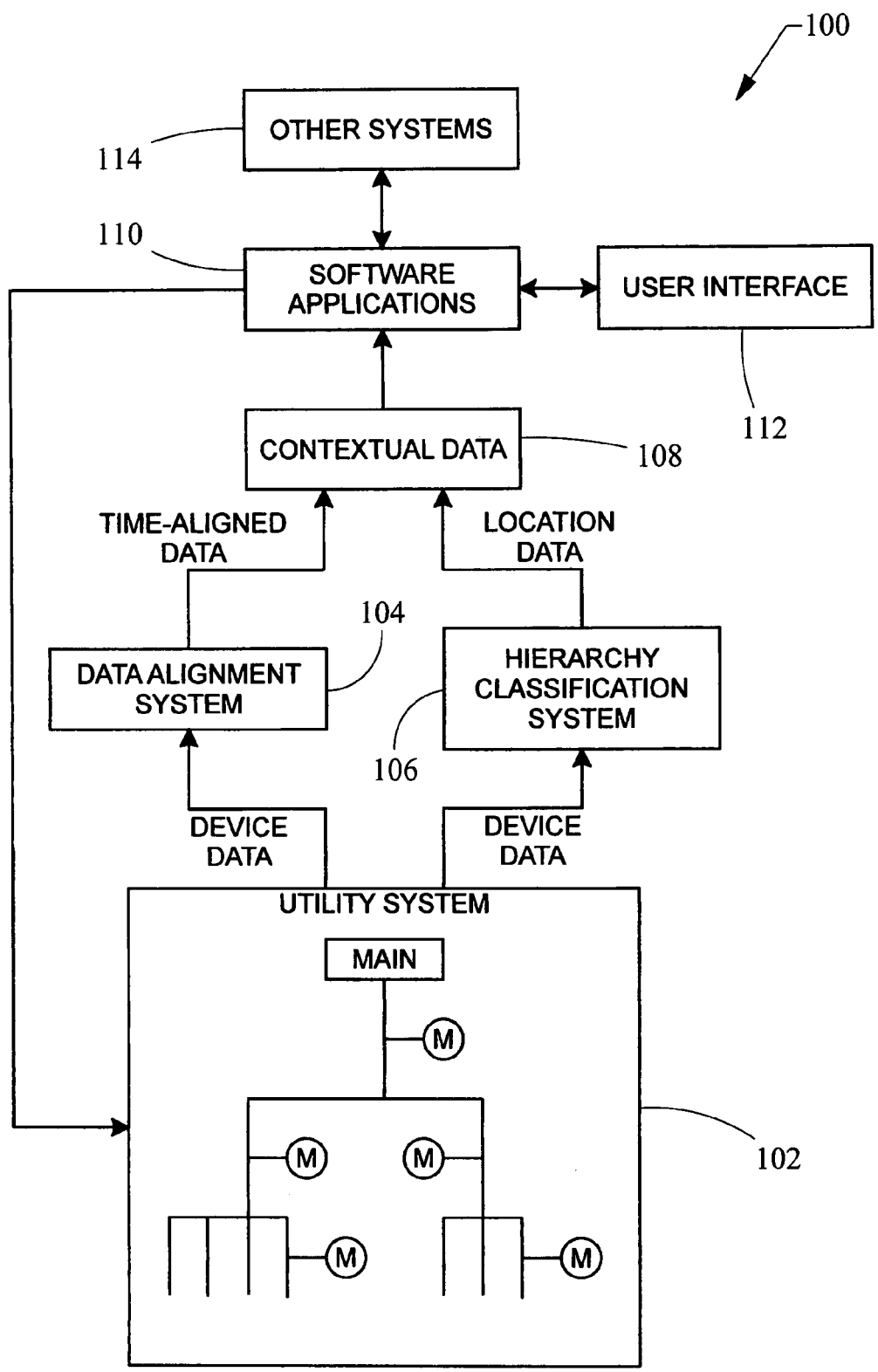
FIG. 1 is functional block diagram of an automated data integration monitoring system including harmonic distortion evaluation software in accordance with the present invention.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE ILLUSTRATED EMBODIMENTS

Turning now to FIG. 1, an automated data integrated monitoring system 100 is generally shown. A utility system 102 having multiple monitoring devices M provides data from each monitoring device M that is communicated to an automated data alignment system 104 and an automated hierarchy classification system 106. The data is aligned automatically in the automated data alignment system 104 in accordance with the present invention and produces data that is aligned such that it represents the data when it was actually seen simultaneously by the monitoring devices M in the utility system 102 and these terms will be used interchangeably throughout. The hierarchy classification system 106 automatically learns the hierarchy of monitoring devices present in the utility system 102 and their relationships relative to one another.

Once the data from each monitoring device M is aligned and each monitoring device's location is known, the data is said to be in context 108. The contextual data 108 can be used by software applications 110 to provide and diagnose useful information about the utility system 102 beyond what is generally available if the data is not in context. The utility being monitored in the utility system 102 can be any of the five utilities designated by the acronym, WAGES, or water, air, gas, electricity, or steam. Each monitoring device measures characteristics of the utility, and quantifies these characteristics into data that can be analyzed by a computer.

A user interacts with the software applications 110 via a conventional user interface 112. The software applications 110 can be linked to other systems 114, such as a billing system, and use the contextual data 108 to communicate messages between the other systems 114 and the user interface 112.

The data alignment system 104 aligns data, such as voltage, current, time, events, and the like, from multiple monitoring devices M in a utility system, and is a valuable tool for users. When data from all the monitoring devices M is aligned to the same point in time that the data occurred, the data can be put into a temporal context from which additional decisions regarding hardware and software configuration can be automatically made or recommended. As used herein, a monitoring device refers to any system element or apparatus with the ability to sample, collect, or measure one or more operational characteristics or parameters of the utility system 102. When the utility system 102 is a power monitoring system, the monitoring device M can be a meter that measures electrical characteristics or parameters of the power monitoring system.

The data alignment techniques (which are detailed below) according to various aspects of the present invention accomplish at least the following:

1) Automated alignment of data in monitoring devices;

2) Automated synchronization of time in monitoring devices;

3) Alignment of data and time in monitoring devices located at different points on the power utility grid (where the monitoring system software may obtain time data from the Internet or another server); and 4) Diagnosing misidentification or mislabeling of phases throughout the electrical power system.

All real-world electrical signals in power systems experience subtle variations in their frequency and amplitude over time. This variation of the signal's frequency and amplitude are both indeterminate and unique with respect to time. Each is monitoring device located on the same utility grid will simultaneously experience the same frequency variations. Analysis of data from monitoring devices that are directly linked to each other in the hierarchy will reveal a correlation in their amplitude variations. Analysis of both the frequency and amplitude variations of the signal are then used to precisely align the data of one monitoring device with respect to another device (or all the monitoring devices to each other) in the data alignment system 104. The details of the data alignment system 104 are discussed below.

The data alignment techniques of the present invention allow all monitoring devices M in a power utility system hierarchy to be aligned to the zero-crossing of all three phase voltages without the use of additional hardware. The present invention also anticipates potential phase shifts between various monitoring devices, for example, those caused by certain transformer configurations. Once the data of the monitoring devices are aligned with each other, the system data is essentially aligned with respect to the time it occurred, making more complex data analyses feasible.

Figure 2:
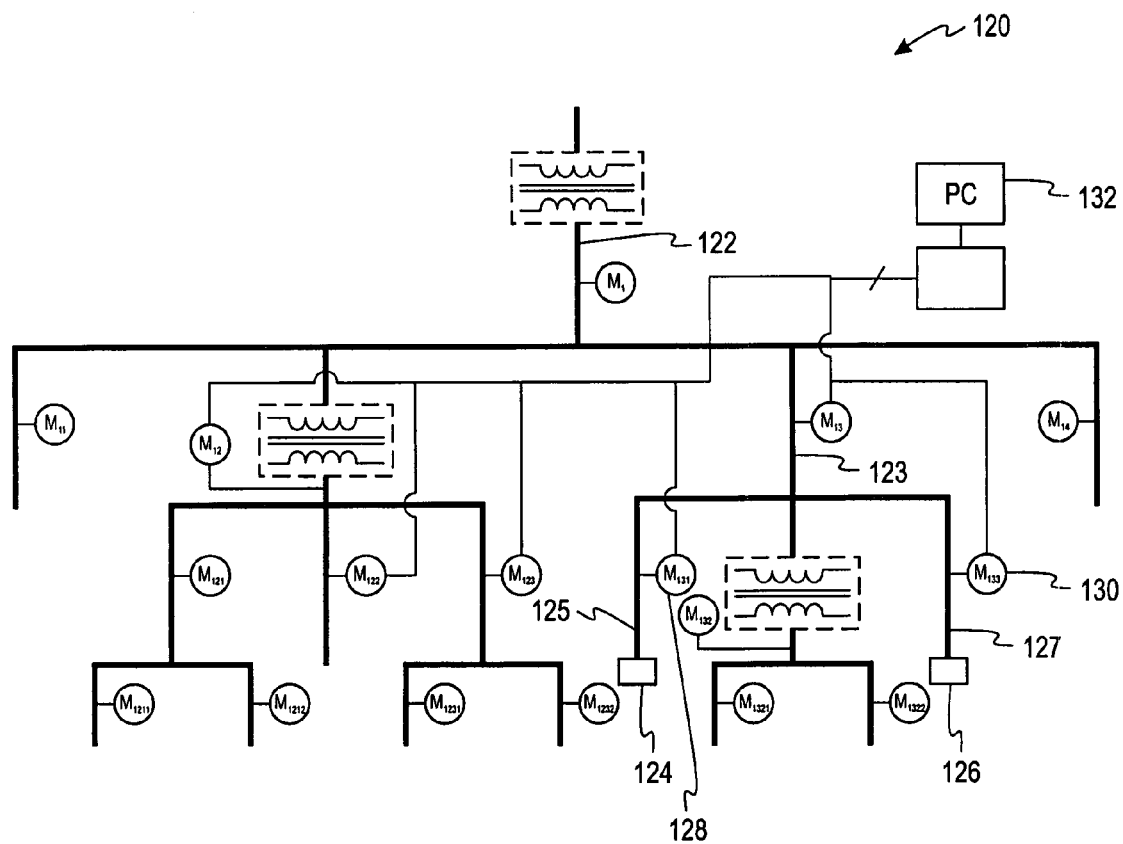
FIG. 2 is a functional block diagram of a simplified power monitoring system which is analyzed by the automated data integration monitoring system in FIG. 1.

A simplified configuration of a power monitoring system 120 is shown in FIG. 2. The power monitoring system 120 includes a main electrical switchgear 122 connected through a feeder 123 to a first load 124 connected to a first branch 125 from the feeder 123 and to a second load 126 connected to second branch 127 from the feeder 123. Example monitoring devices 128, 130 measure electrical characteristics or parameters associated with the first and second branches 125 and 127, respectively. Each monitoring device 128, 130 is communicatively coupled to a computer 132. Other monitoring devices and transformers are shown in FIG. 2. FIG. 2 shows a number of other example monitoring devices communicatively coupled to the computer 132. For the sake of clarity, not every monitoring device in FIG. 2 is shown communicatively coupled to the computer 132. It is to be understood that some or all of the monitoring devices in a power monitoring system such as the power monitoring system 120 may be coupled to the computer 132.

Figure 3:
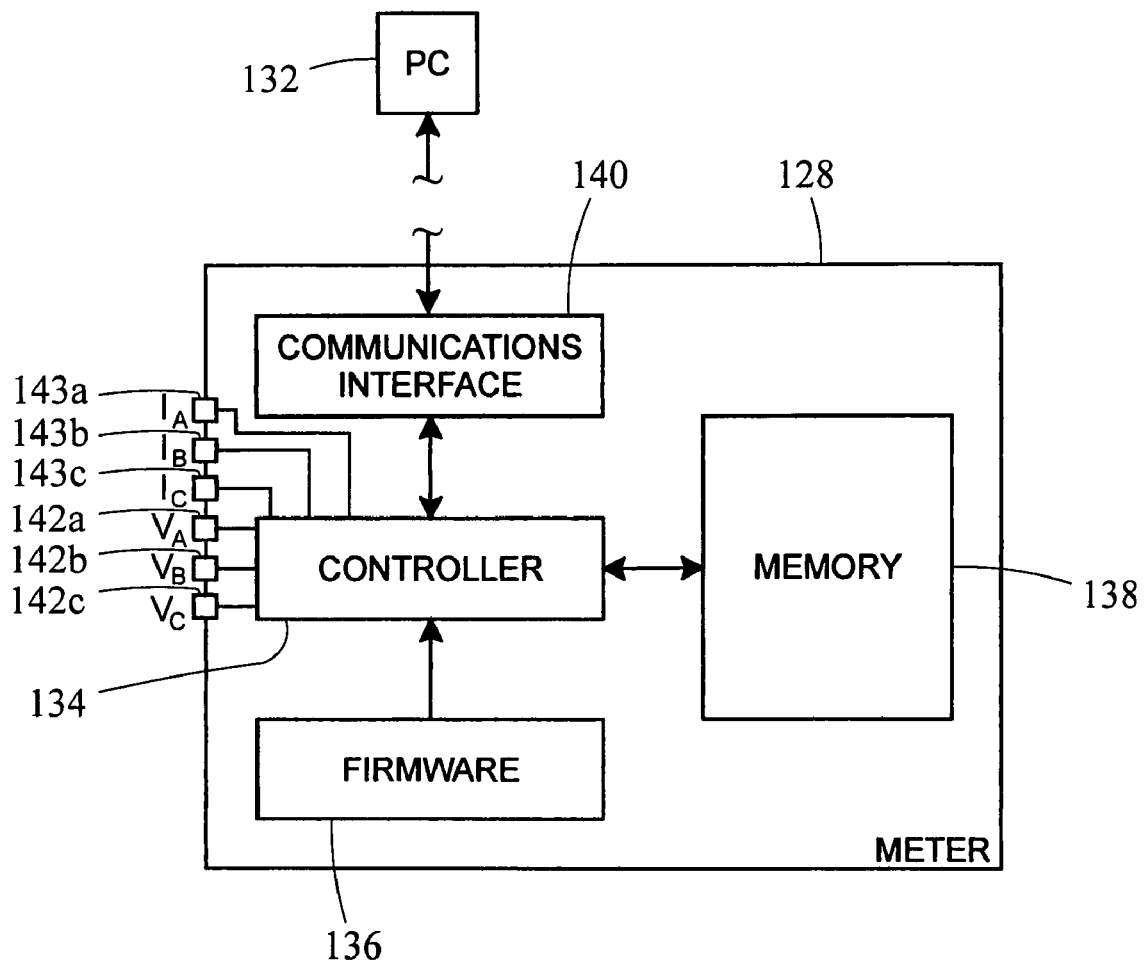
FIG. 3 is a functional block diagram of a monitoring device in accordance with an embodiment of the present invention.

The first monitoring device 128 can be a power meter (or electric meter), such as shown in FIG. 3. The monitoring device 128 includes a controller 134, firmware 136, memory 138, a communications interface 140, and three phase voltage conductor connectors 142$a,b,c$, which connect to the $V_A$, $V_B$, and $V_C$ phase voltage conductors, respectively, and are coupled to the controller 134. Three phase current conductor is connectors 143$a,b,c$, which connect to the $I_A$, $I_B$, and $I_C$ phase current conductors, respectively, are optionally coupled to the controller 134. The firmware 136 includes machine instructions for directing the controller to carry out operations required for the monitoring device. Memory 138 is used by the controller 134 to store electrical parameter data measured by the monitoring device 128.

Instructions from the computer 132 are received by the monitoring device 128 via the communications interface 140. Those instructions include, according to an embodiment of the present invention, instructions that direct the controller 134 to mark the cycle count, to begin storing electrical parameter data, or to transmit to the monitoring system software 132 electrical parameter data stored in the memory 138. The electrical parameter data can include any data acquired by monitoring devices, including any combination of frequency variations, amplitude variations, and phase variations.

The present invention provides an algorithm that precisely, automatically, and temporally aligns the data from multiple monitoring devices to the same voltage zero-crossing. Other data alignment aspects discussed below are based on this capability. The data alignment aspect of the present invention is facilitated by functionality in both the monitoring device 128 and the monitoring system software running on the computer 132, and the requirements of each will be discussed individually. Collection and partial analysis of data is performed in the monitoring device 128.

From the time the monitoring device 128 is energized, a cycle count is performed of the measured voltage signals. The cycle count is sequentially iterated with each positive voltage zero-crossing (or, alternately, with each negative voltage zero-crossing). As the monitoring device 128 measures both the frequency and amplitude variations of the voltage and current from cycle to cycle, a comparison is performed to their respective nominal values. The frequency and amplitude variations and associated cycle count are tracked by the device firmware 136. The associated monitoring device time at any specified cycle count can be stored in the memory 138.

The monitoring system software executed by the computer 132 initiates alignment of the data associated with multiple monitoring devices by sending a global command to all monitoring devices 128, 130 on the power monitoring system 120 to is mark their cycle count, time and buffer a predetermined amount of cycle-by-cycle data.

This predetermined amount of data is established based on the number of monitoring devices in the power monitoring system, the communications time delays in the power monitoring system and the magnitude of frequency and amplitude variations. When the buffering is complete, the monitoring devices 128, 130 transmit their buffered data to the computer 132.

Once the data is collected by the monitoring devices 128, 130, the monitoring system software uploads the buffered data for analysis. There will likely be a time offset in each monitoring device's buffered data because the monitoring devices on the system will likely not begin buffering the data simultaneously due to communications time delays in the power monitoring system and internal time delays within the monitoring devices. The buffered data is analyzed by the monitoring system software on the computer 132 to locate the highest correlation in frequency between all the monitoring devices 128, 130. Generally, the highest correlation is located by sliding the buffered frequency data in one monitoring device with respect to another until the frequency variations line up with each other as shown in FIG. 4.

The frequency data 360 for the monitoring device 128 is "slid" relative to the frequency data 362 for the monitoring device 130 until the frequency data for each device line up. Thus, the zero-crossing associated with $\Delta t_1$ of monitoring device 128 is aligned with the zero-crossing associated with $\Delta t_1$ of monitoring device 130, the zero-crossing associated with $\Delta t_2$ of monitoring device 128 is aligned with the zero-crossing associated with $\Delta t_2$ of monitoring device 130, and so on. Cross-correlation algorithms for "sliding" two data sets relative to one another until they are aligned are discussed in further detail below in connection with FIGS. 5a and 5b.

Once the buffered data is aligned, the cycle count of the first monitoring device 128 is associated with the cycle count of the second monitoring device 130 in the software on the computer 132. The on-board monitoring device time may optionally also be aligned or associated relative to one another. This process is repeated for each monitoring device in the power monitoring system 120 until all devices' cycle counts are associated with each other. During the data alignment process, the monitoring system software on the computer 132 builds a matrix of each device's cycle count and time with respect to each other and the time on the computer 132.

Although FIG. 2 shows a simplified power monitoring system 120 with just two monitoring devices 128, 130, the data alignment embodiments of the present invention can be applied to any power monitoring system 120 of any complexity with multiple hierarchical levels, such as the one-line diagram shown in FIG. 7. For ease of illustration and discussion, only two monitoring devices 128, 130 have been discussed.

Once the data of the two monitoring devices 128, 130 is aligned relative to one another, there is typically no need to realign the data again unless a monitoring device loses its voltage signal or resets itself. In those cases, only the monitoring devices that lose their voltage signal or reset need to be realigned in accordance with the present invention. The data alignment technique of the present invention can be initiated by an event, such as an undervoltage or overvoltage condition, connecting or disconnecting a load to the power monitoring system, a change in the characteristics of the voltage, current, or a load, a monitoring device reset, or a power loss.

The data alignment technique of the present invention can also be initiated automatically by the monitoring software or manually by the user.

Figure 5A:
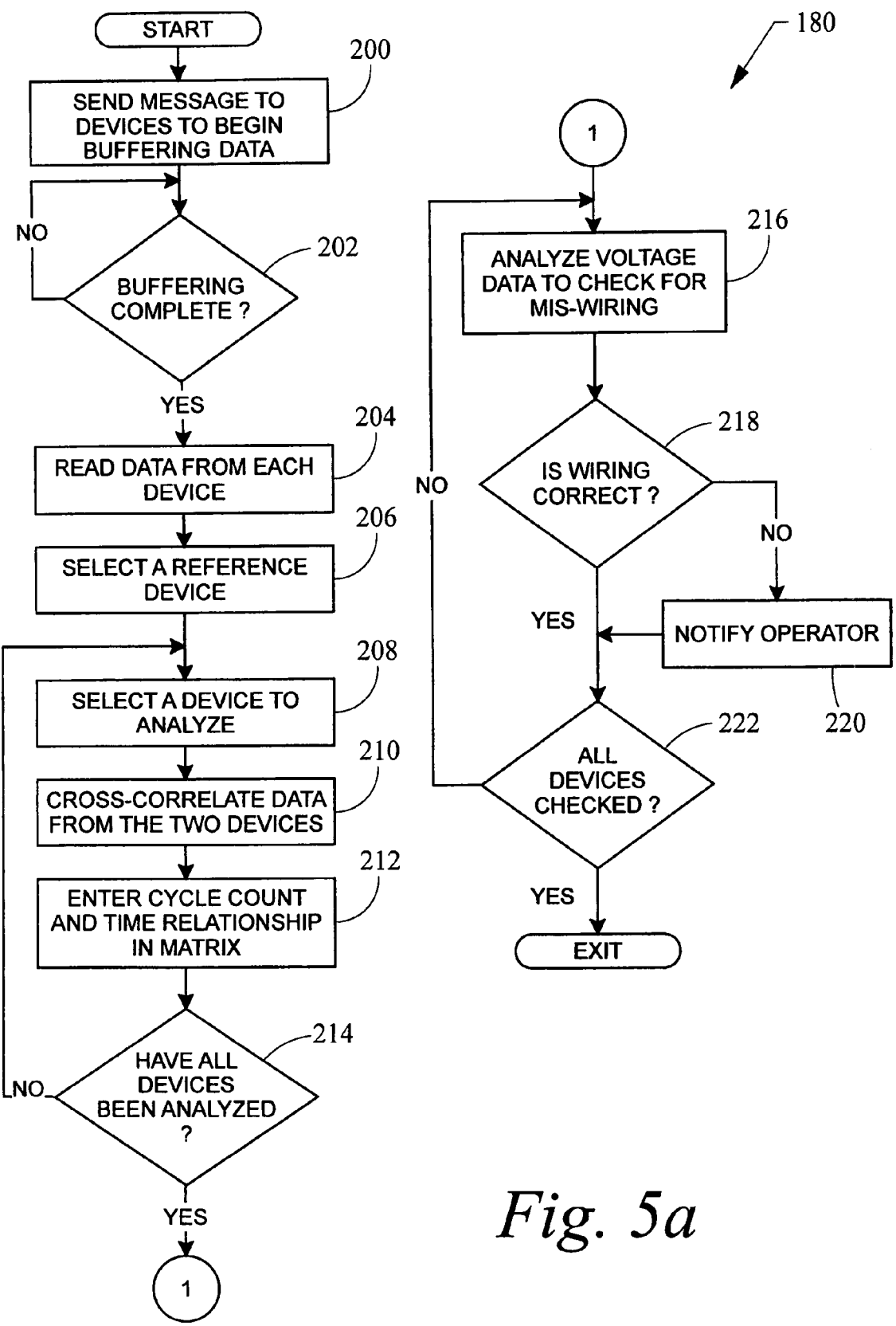
FIG. 5a is a flow chart diagram of a data alignment algorithm in accordance with an embodiment of the present invention.

Turning now to FIG. 5a, a flow chart, which can be implemented as a data alignment algorithm 180 executed by the computer 132, is shown for carrying out an embodiment of the present invention. The data alignment algorithm 180 begins by sending a message to the monitoring devices (such as monitoring devices 128, 130) to begin buffering data (200) until buffering is complete (202). The computer 132 reads the data from each device (204). The data represents, in an embodiment, electrical parameter data such as variations in (fundamental) frequency, variations in amplitude, and variations in phase. Preferably, the data represents variations in fundamental frequency. Fundamental frequency is a preferred criterion because it remains unchanged throughout the power monitoring system, even if transformers are present in the system. Amplitude and phases can shift when transformers are present in the system; however, the present invention contemplates using amplitude and phase information as criteria.

The computer 132 selects a reference monitoring device (206) such as monitoring device 128 and then selects a monitoring device to analyze (208) such as monitoring device 130. Data from the monitoring devices 128, 130 is then cross-correlated according to the present invention (210), and each device's cycle count and time relationships are entered into a matrix (212). The cross-correlation is carried out by is a conventional cross-correlation algorithm, preferably such as the one provided below in Equation 1.

$$r(d) = \frac{\sum_i [(x(i) - mx) * (y(i - d) - my)]}{\sqrt{\sum_i (x(i) - mx)^2} \sqrt{\sum_i (y(i - d) - my)^2}}$$ (Equation 1)

The correlation coefficient is represented by r(d), the delay (offset or shift) being represented by d, where $-1 <= r(d) <= 1$ for two series x(i) and y(i) representing the respective data from the monitoring devices 128, 130; and mx and my are the means of the corresponding series x(i) and y(i). According to an embodiment, the correlation algorithm is a circular correlation algorithm in which out-of-range indexes are "wrapped" back within range. In another embodiment, the correlation algorithm is a linear correlation algorithm in which each series is repeated. In still other embodiments, the correlation algorithm is a pattern-matching algorithm or a text-search algorithm.

After cross-correlation, the computer 132 checks whether all monitoring devices have been analyzed (214), and if so, proceeds to check the wiring of the phase conductors. In many instances, phase conductors may be misidentified throughout an electrical system by the contractor who installed them. For example, the phase that is identified as "A-phase" at the main switchgear may be identified as "B-phase" at the load. This nomenclature misidentification of the phase conductors can result in confusion, and even pose a safety hazard.

To mitigate this hazard, the computer 132 analyzes the voltage (or current) data by sampling data at the voltage (or current) zero-crossing of a reference channel on each monitoring device (216). The computer 132 determines whether the wiring is correct (218) by determining whether the values of the sampled data are zero, negative, or positive, and, based on those values, assigning phase notations (such as A, B, or C) for each reference channel. If all monitoring devices are identified accurately, the data values for Phase-A should be approximately zero. If the data values are negative, then the phase in question is the "B-Phase" for an ABC phase rotation. If the data values are positive, then the phase in question is the "C-phase" for an ABC phase rotation. The user is notified (220) whether the wiring is correct. Once the proper phase notation is determined for each monitoring device (222), the computer 132 may then allow the user to correct the misidentified phase notation in any or all monitoring devices. The phase diagnosis embodiments according to the present invention are applicable to voltage inputs as well as current inputs.

Figure 5B:
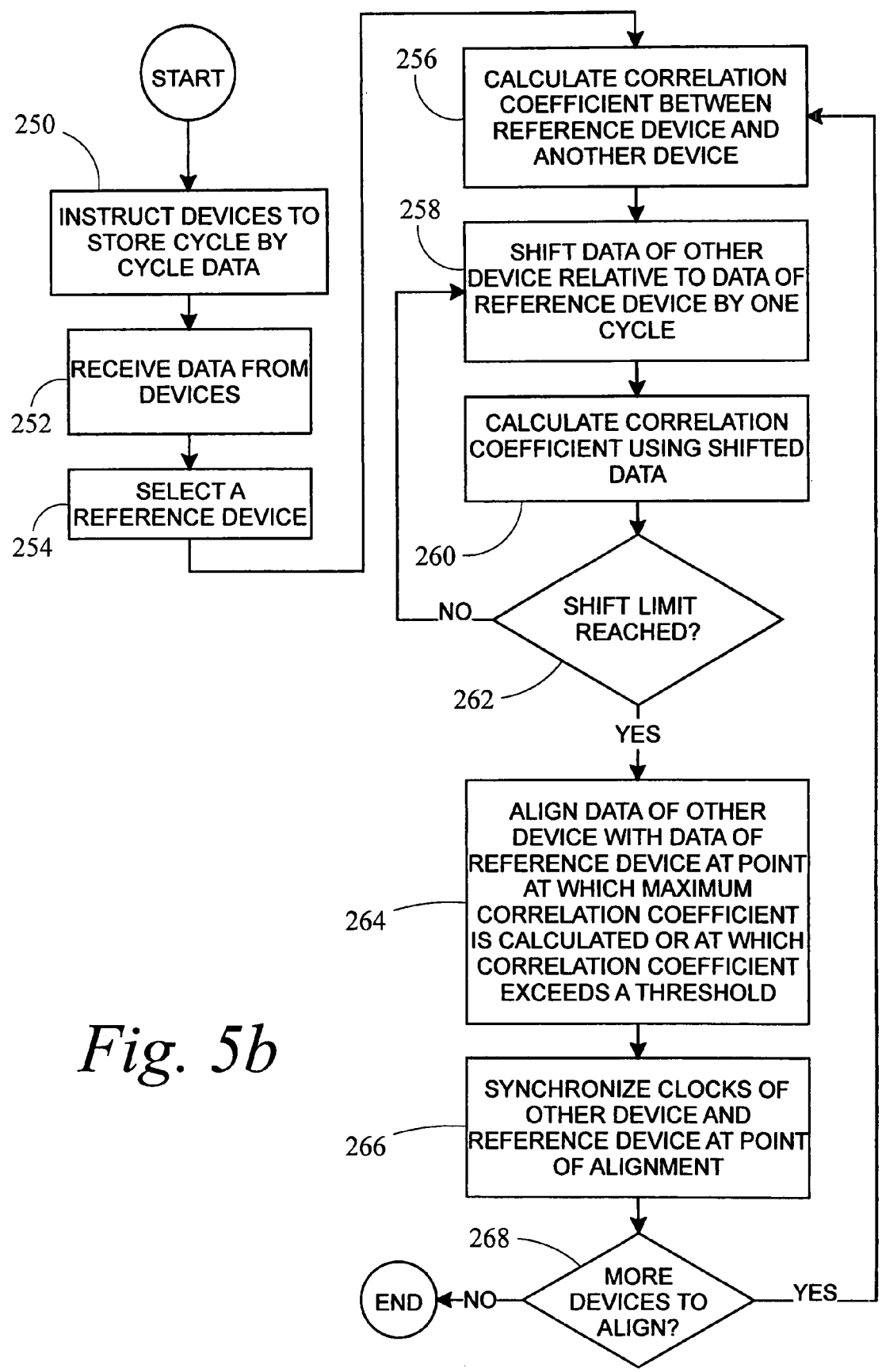
FIG. 5b is a flow chart diagram of a data alignment algorithm in accordance with another embodiment of the present invention.

FIG. 5b illustrates a flow chart for carrying out another embodiment of the present invention. As with FIG. 5a, reference will be made to the power monitoring system 120 shown in FIG. 2 for ease of discussion, but as mentioned before, the data alignment techniques of the present invention are applicable to any utility monitoring system.

The computer 132 instructs each monitoring device in the power monitoring system 120 to store data on a cycle-by-cycle basis (250) for a predetermined number of cycles, preferably between about 1,000 and about 10,000 cycles. When a sufficient amount of data has been stored by the monitoring devices, the computer 132 receives the data from the monitoring devices (252) and selects a reference monitoring device (254). Using a conventional cross-correlation algorithm such as Equation 1 above, the computer 132 calculates a correlation coefficient r(d) between at least a portion of the data (such as about 400 cycles) of the reference monitoring device and the data of a second monitoring device (256). The calculated correlation coefficient is stored, and the data of the second monitoring device is shifted relative to the reference device by one cycle (258).

As mentioned above, the out-of-range indexes can be wrapped back within range according to a circular correlation algorithm or the indexes can be repeated according to a linear correlation algorithm. A correlation coefficient is calculated using the shifted data (260) and if no further shifts are required (262), the data of the second monitoring device is aligned with the data of the reference device at the point at which the maximum correlation coefficient is calculated or at which the correlation coefficient exceeds a threshold value, such as 0.5 (264). It should be noted that when the correlation coefficient r(d) is close to 1.0, the algorithm can exit without conducting any further shifts.

The computer 132 synchronizes the clocks of the second monitoring device and the reference device at the point of alignment (266). The computer 132 reads the cycle count in each monitoring device and the associated monitoring device's on-board clock time. A monitoring device's on-board clock time and cycle count may drift with respect to each other due to the limitations of the on-board clock. Once the data is is aligned, the cycle count is considered the absolute reference for a monitoring device. Due to the clock drift, it may be necessary to re-read the time associated with a device's cycle count periodically to reestablish the device's time. The software on the computer 132 will then update the matrix containing the monitoring device time information.

Another capability of this feature is to allow all on-board monitoring device clocks to be periodically reset to the same value to provide a standard time for the entire power monitoring system. Preferably, the time within the monitoring system software (running on the computer 132) is set according to some absolute time reference. Once the computer time is set, the monitoring system software resets the time on all the monitoring devices accordingly. In this embodiment, the data and time of each monitoring device and the software would be more accurately aligned with the absolute time reference.

When there are no further monitoring devices to align (268), the procedure ends. In an alternate embodiment, all of the monitoring device's data is aligned before the clocks are synchronized (266).

Another advantage of the data alignment techniques of the present invention is the ability to align data and time on different points of the utility grid. If monitoring devices are located on two different points of the same utility grid, it is possible to align the monitoring devices together. In this embodiment, the monitoring devices at each geographic location are first aligned to each other in accordance with the present invention. The software managing all the systems is then used as the absolute time reference for all systems, giving them all a common point of reference.

Referring back to FIG. 1, the integrated monitoring system 100 includes the hierarchy classification system 106. Having a thorough knowledge of an electrical power system's layout is essential to understanding and characterizing the system. Power meters typically provide only the electrical system's operating parameters, but do not give information on how the parameters at different monitoring points on the electrical system relate to each other. Having the hierarchy of an electrical system puts the operating parameters of multiple monitoring devices into spatial context with each other. This spatial context gives the user a more powerful tool to troubleshoot system problems, improve system efficiencies, predict failures and degradation, locate the source of disturbances, or model system responses.

The hierarchy classification system 106 of the present invention allows the monitoring system software to collect data from the monitoring device on the utility system 102, and automatically determine the hierarchy of the utility system 102 with little or no user input. The level of detail given by the hierarchy classification system 106 directly correlates with the number and extent of monitoring devices in the utility system 102. As supplemental monitoring devices are added, the auto-learned hierarchical algorithm according to the present invention enables them to be automatically incorporated into the determined hierarchical structure.

A hierarchy of nodes is based on a relationship that determines that one node is always greater than another node, when the nodes are related. A hierarchy's relationship can link or interrelate elements in one of three ways: directly, indirectly, or not at all. An illustration of a direct link or interrelationship is shown in FIG. 6 between the $Load_2$ 310 and $Feeder_2$ 306. In contrast, an indirect link exists between $Load_2$ 310 and $Main_1$ 302. Finally, there is effectively no link between the $Load_1$ 308 and $Load_2$ 310 and between $Feeder_1$ 304 and $Feeder_2$ 306.

In the case of a power system hierarchy, an objective is to order elements in the power system so as to represent the true connection layout of the power system. Determining the hierarchy of a power system provides important information that can be used to solve problems, increase equipment and system performance, improve safety, and save money. The level of detail contained in a power system hierarchy will depend on both the number of elements or nodes that are being monitored and the node's ability to provide feedback to the auto-learned hierarchy algorithm in the monitoring system software running on the computer 132.

Generally, the hierarchy classification system 106 according to the present invention utilizes an auto-learned hierarchy algorithm in the monitoring system software that is based on rules and statistical methods. Periodically, the monitoring system software polls each monitoring device in the utility system 102 to determine certain to characteristics or parameters of the utility system 102 at that node (represented by monitoring device M). Multiple samples of specified parameters are taken from each meter in the system at the same given point in time. Once the parameter data is collected from each node M in the utility system 102, the auto-learned hierarchy algorithm analyzes the data and traces the relationships or links among the monitoring devices with respect to the time the data sample was taken and the associated value of the data sample. This analysis may be performed periodically to increase the probability that the hierarchy is accurate, or to ascertain any changes in the hierarchy. Once this iterative process reaches some predetermined level of statistical confidence that the determined layout of the utility system 102 is correct, the auto-learned hierarchy algorithm ends. The final layout of the utility system 102 is then presented to the user for concurrence. As each monitoring device's data is evaluated over time (the learning period) with respect to all other monitoring devices using the auto-learned hierarchy algorithm, a basic layout of the hierarchical structure of the utility system 102 is determined based on the monitoring points available. In this respect, the algorithm according to the present invention uses historical trends of the data from each monitoring device, and those trends are compared to determine whether any interrelationship (link) exists between the monitoring devices. A more detailed hierarchical structure can be determined with more monitoring points available for analysis.

A benefit of the auto-learned hierarchy algorithm of the present invention is to provide automatically a basic hierarchical structure of a utility system being monitored with minimal or no input by the user. The hierarchy can then be used as a tool for evaluation by other systems 114. Another benefit is that the present invention improves the accuracy of the time synchronization between the monitoring devices and the monitoring system software.

In an embodiment in which the utility system 102 is a power monitoring system, samples of specific electrical parameters (such as power, voltage, current, or the like) are simultaneously taken from each monitoring device in the power monitoring system. This parameter data is stored and analyzed with respect to the time the sample is taken, the associated value of the data point, and the monitoring device providing the data.

Data taken from each monitoring device in the power monitoring system is compared with each other to determine whether any correlation exists between the monitoring devices. The data is analyzed for statistical trends and correlations as well as similarities and differences over a predetermined period of time in accordance with the present invention.

According to an embodiment, one or more rules or assumptions are used to determine the hierarchical order of the power system. Certain assumptions may have to be made about the utility system in order to auto-learn the utility system's hierarchy. The assumptions are based on Ohm's Law, conservation of energy, and working experience with typical power distribution and power monitoring systems.

General rules that may be made by the auto-learned hierarchy algorithm in connection with power systems and power monitoring systems include:

1. The power system being analyzed is in a single 320 (FIG. 7) or multiple radial feed configuration 330 (FIG. 8).
2. The meter measuring the highest energy usage is assumed to be at the top of the hierarchical structure (e.g., Main 322 shown in FIG. 7).

3. The rate of sampling data by the meters is at least greater than the shortest duty cycle of any load.

4. Energy is consumed (not generated) on the power system during the parameter data collection process.

5. The error due to the offset of time in all meters on the power monitoring system is minimal where data is pushed from the monitoring device to the monitoring system software running on the computer 132.

The following additional parameters may be present for the auto-learned hierarchy algorithm:

1. Data is not collected for hierarchical purposes from two monitoring devices installed at the same point of a power system.

2. Meters with no load are ignored or only use voltage information to determine their position in the hierarchy.

3. Multiple mains (Main1, Main2, Main3, etc.) may exist in the power system.

4. Data is provided to the monitoring system software by each monitoring device in the system.

5. Loads that start or stop affect the load profiles for any corresponding upstream metered data with a direct or indirect link to that load.

6. Voltage characteristics (fundamental, harmonic, symmetrical components) are relatively consistent for all monitoring devices on the same bus.

7. Transformer losses on the electrical system are minimal with respect to the loads downstream from the transformer.

8. General correlation (over time) of loads between monitoring devices indicates either a direct or indirect link.

9. Multiple unmetered loads at a point in the power system are aggregated into a single unknown load.

Any of the foregoing assumptions and parameters can be combined for a radial-fed electrical power system. For example, in a specific embodiment, the following rule-based assumptions and parameters can be utilized:

1. Voltages and currents are higher the further upstream (closer to the top of the hierarchy) a monitoring device is.

2. Harmonic values are generally lower the further upstream a monitoring device is.

3. Transformers can vary the voltages and currents.

4. Total power flow is higher upstream than downstream.

5. The power system is a radial-fed system.

6. Two monitoring devices will not be installed at the same point.

7. Monitoring devices with the same voltage distortion are adjacently connected.

8. The total load measured at a specific hierarchical level is equal (excluding losses) to the sum of all measured and unmeasured loads directly linked to that hierarchical level.

Monitoring devices are considered to be on the same hierarchical level if they are all directly linked to the same reference device. For example, referring to FIG. 7, a simplified one-line diagram of a utility monitoring system 320 is shown having five distinct levels represented by 323*a,b,c,d,e*. In the specific case of a power monitoring system, each level represents a feeder to which multiple monitoring devices can be directly linked. All monitoring devices directly linked to a feeder are considered to be on the same feeder level. Thus, the main 322 is directly linked to the feeder 323*a*, and thus exists on its own level in the hierarchy. Feeder 323*b* directly links to three monitoring devices, and therefore comprises another distinct level. Feeder 323*c* comprises another level distinct from feeders 323*a* and 323*b* because the monitoring devices directly linked to feeder 323*c* are not directly linked to feeders 323*a* or 323*b*. In the case of a water, air, gas, and steam systems, each level may be represented by a header instead of a feeder.

Figure 9:
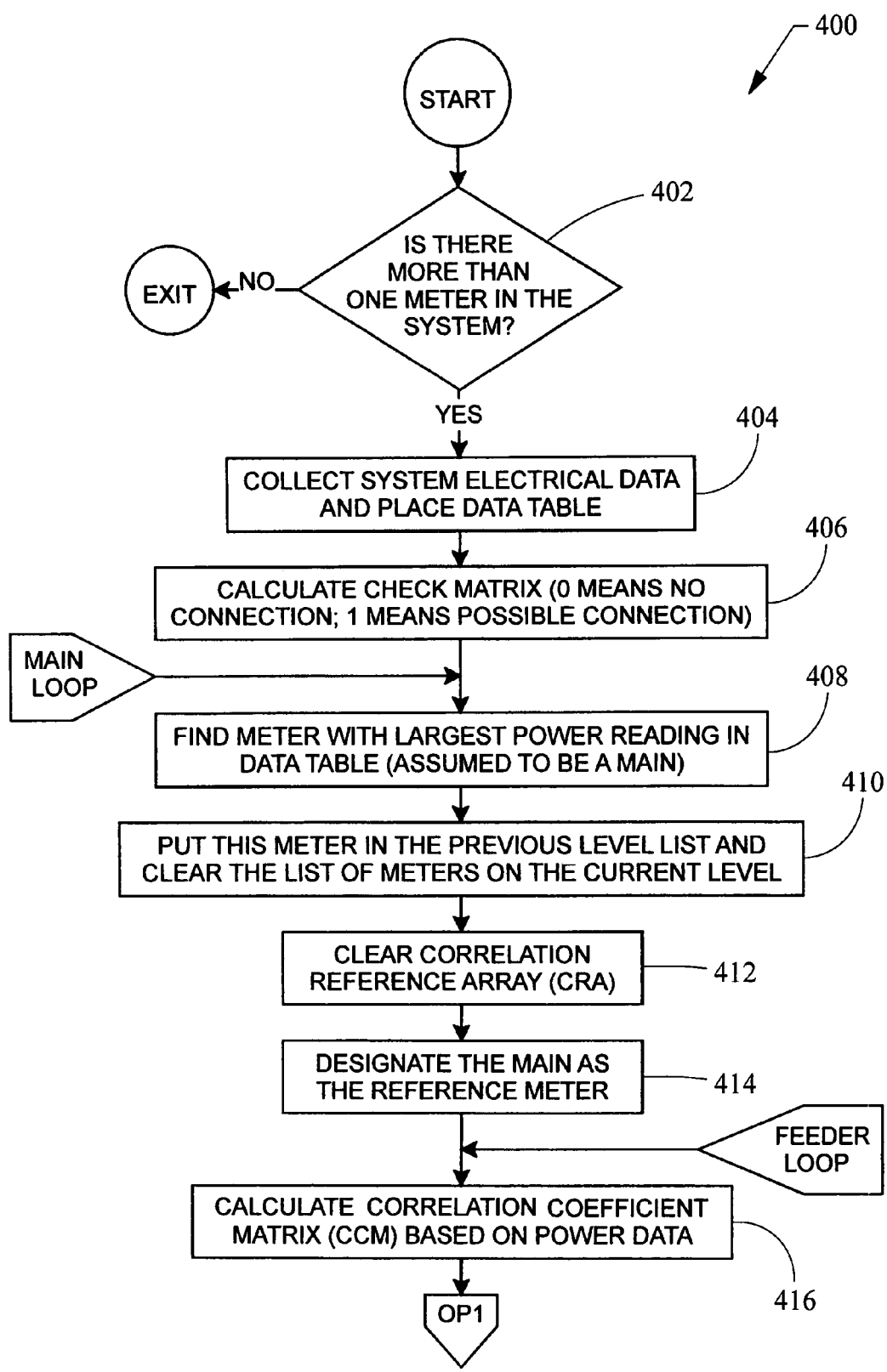
FIGS. 9, 10, and 11a illustrate a flow chart diagram of an auto-learned hierarchy algorithm in accordance with an embodiment of the present invention.
Figure 10:
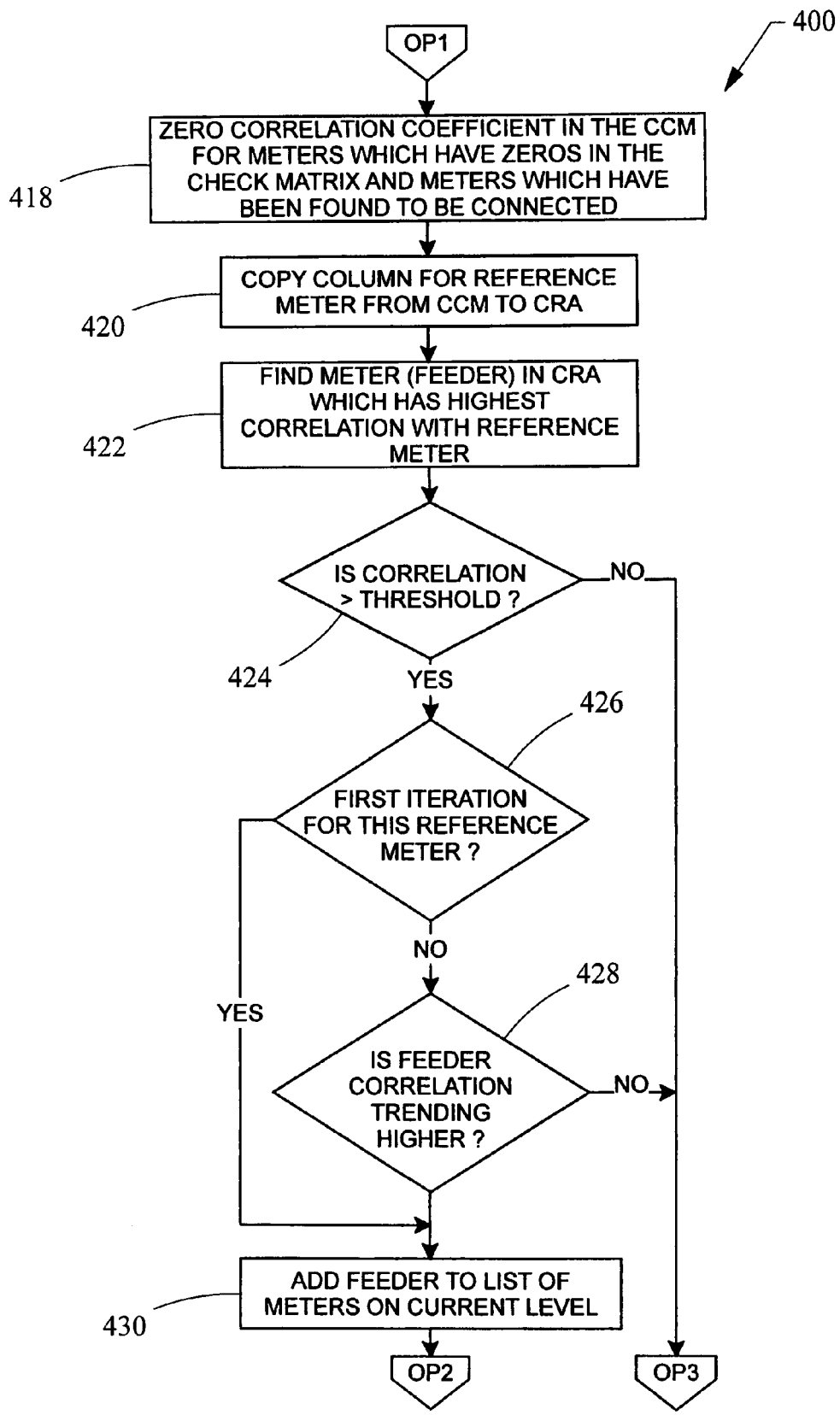
Figure 11A:
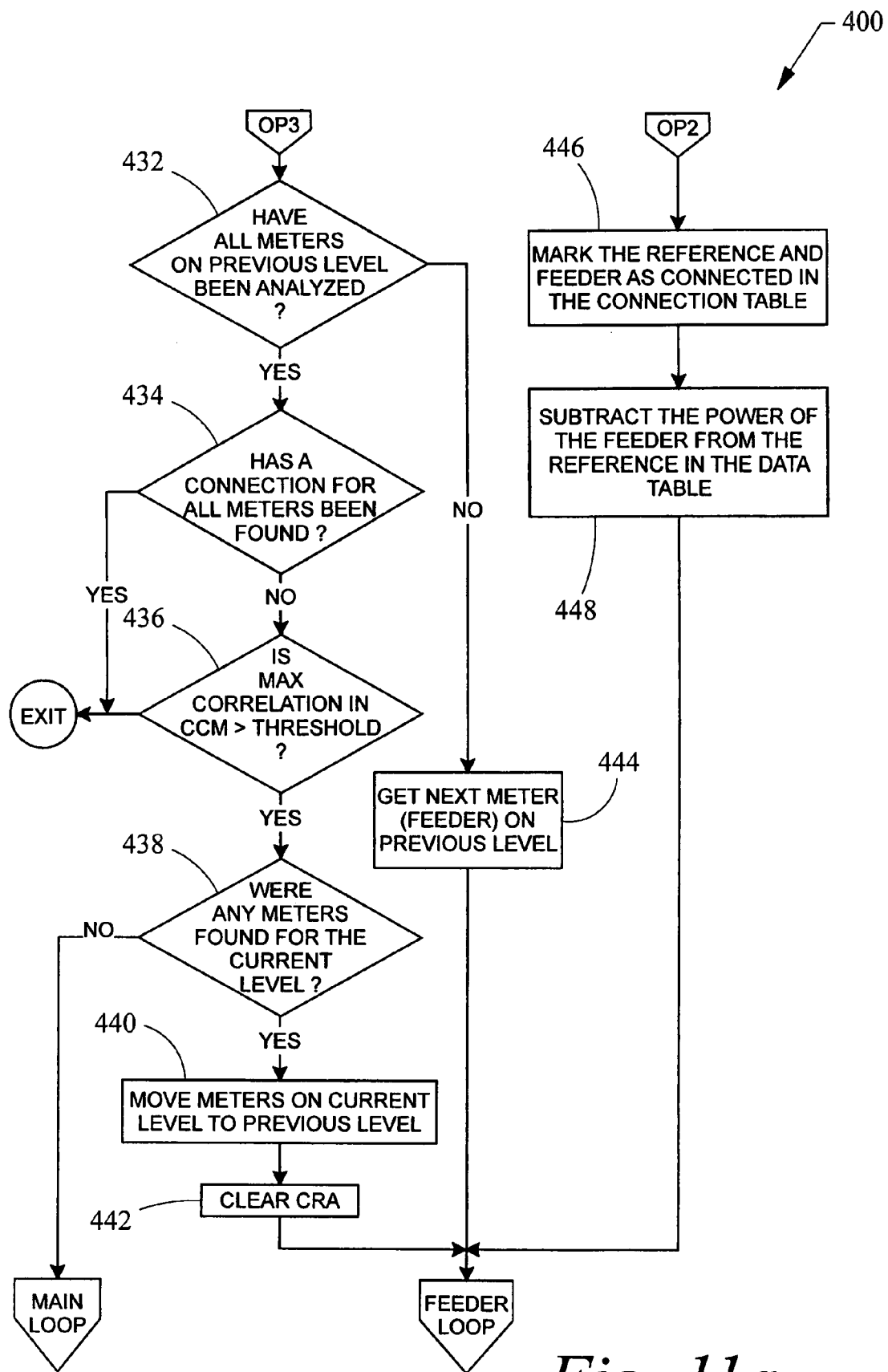

A specific aspect of the auto-learned hierarchy algorithm 400 in accordance with an embodiment of the present invention is flow-charted in FIGS. 9, 10 and 11*a*. The algorithm 400 first checks whether there is more than one monitoring device in the system (402), and if not, the algorithm ends. If more than one monitoring device is present, electrical data is taken from each monitoring device ($M_1, M_2, \ldots, M_k$) and compiled into a Data Table (404). The Data Table tabulates the raw data (such as power, voltage magnitude, voltage distortion, current magnitude, current distortion, or symmetrical component data) taken at regular intervals ($T_1, T_2, \ldots, T_n$) over a given time period. The time period between samples depends on the shortest duty cycle of any load in the power monitoring system. The maximum time period ($T_n$) is determined based on the level of variation of each monitoring device's load in the power monitoring system. The monitoring device with the maximum power in the Data Table is assumed to be a Main (i.e., highest level in the electrical hierarchy) (408). However, the present invention also contemplates multiple hierarchies (i.e., multiple Mains). An example of the Data Table is shown in Table 1 below.

TABLE 1

Data Table Example

| Time | Meter 1 | Meter 2 | Meter 3 | Meter 4 | ... | Meter k |
|---|---|---|---|---|---|---|
| $T_1$ | $D_{11}$ | $D_{21}$ | $D_{31}$ | $D_{41}$ | ... | $D_{k1}$ |
| $T_2$ | $D_{12}$ | $D_{22}$ | $D_{32}$ | $D_{42}$ | ... | $D_{k2}$ |
| $T_3$ | $D_{13}$ | $D_{23}$ | $D_{33}$ | $D_{43}$ | ... | $D_{k3}$ |
| $T_4$ | $D_{14}$ | $D_{24}$ | $D_{34}$ | $D_{44}$ | ... | $D_{k4}$ |
| . | . | . | . | . | . | . |
| . | . | . | . | . | . | . |
| . | . | . | . | . | . | . |
| $T_n$ | $D_{1n}$ | $D_{2n}$ | $D_{3n}$ | $D_{4n}$ | ... | $D_{kn}$ |

Once the data for the Data Table is accumulated, a Check Matrix is developed. The Check Matrix is a matrix of logical connections based on the Data Table. A zero (0) indicates that no direct link exists between any two monitoring devices, and a one (1) indicates that there is a possible relationship between two monitoring devices. An exemplary Check Matrix is illustrated in Table 2 below. In Table 2, it is assumed that no link exists between Meter 1 and Meter 2. This is because the power measured by Meter 1 exceeds Meter 2 in one entry of the Data Table and the power measured by Meter 2 exceeds Meter 1 in another entry of the Data Table. Meter 1 always correlates with itself so an NA is placed in that cell of the Check Matrix. Only half of the Check Matrix is required due to the redundancy of information.

TABLE 2

Check Matrix Example

| | Meter 1 | Meter 2 | Meter 3 | Meter 4 | ... | Meter k |
|---|---|---|---|---|---|---|
| Meter 1 | NA | 0 | 1 | 1 | ... | 0 |
| Meter 2 | 0 | NA | 1 | 0 | ... | 1 |
| Meter 3 | 1 | 1 | NA | 0 | ... | 1 |
| Meter 4 | 1 | 0 | 0 | NA | ... | 0 |
| . | . | . | . | . | ... | . |
| . | . | . | . | . | ... | . |
| . | . | . | . | . | ... | . |
| Meter k | 0 | | 1 | 0 | ... | NA |

Once the Check Matrix is determined, the data from each monitoring device in the Data Table is used to develop a Correlation Coefficient Matrix (CCM) shown in Table 3 below. In the CCM, a statistical evaluation is carried out to determine the linear relationship of each monitoring device in the electrical system with respect to the other monitoring devices in the matrix. The correlation coefficient between any two monitoring devices is determined and placed in the appropriate cell in the CCM. In the exemplary Table 3 below, $C_{12}$ is the correlation coefficient of Meter 1 with respect to Meter 2. The higher the correlation coefficient value is, the higher the probability that these two monitoring devices are either directly or indirectly linked. Conversely, the lower this number is, the lower the probability that these two monitoring devices are directly or indirectly linked. Equation 2 below is used to determine the correlation coefficient between any two given monitoring devices:

$$\rho_{x,y} = \frac{\text{Cov}(x, y)}{\sigma_x \sigma_y} \quad \text{(Equation 2)}$$

where: $\rho_{x,y}$ is the correlation coefficient and lies in the range of $-1 \leq \rho_{x,y} \leq 1$; Cov(x,y) is the covariance of x and y; and $\sigma_x$ and $\sigma_y$ are the standard deviations of x and y, respectively.

$$\text{Cov}(x, y) = \frac{1}{n} \sum_{j=1}^{n} (x_j - \mu_y)(y_j - \mu_y) \quad \text{(Equation 3)}$$

where: n is the number of data elements in x and y, and $\mu_x$ and $\mu_y$ are the mean values of x and y respectively.

The diagonal cells of the Correlation Matrix are all always 1 because each meter has 100% correlation with itself. Again, only half of the Correlation Matrix is required due to the redundancy of data (e.g., $C_{12}=C_{21}$).

TABLE 3

Correlation Coefficient Matrix (CCM) Example

|  | Meter 1 | Meter 2 | Meter 3 | Meter 4 | ... | Meter k |
|---|---|---|---|---|---|---|
| Meter 1 | 1 | $C_{12}$ | $C_{13}$ | $C_{14}$ | ... | $C_{1k}$ |
| Meter 2 | $C_{21}$ | 1 | $C_{23}$ | $C_{24}$ | ... | $C_{2k}$ |
| Meter 3 | $C_{31}$ | $C_{32}$ | 1 | $C_{34}$ | ... | $C_{3k}$ |
| Meter 4 | $C_{41}$ | $C_{42}$ | $C_{43}$ | 1 | ... | $C_{4k}$ |
| . | . | . | . | . | 1 | . |
| . | . | . | . | . |  | . |
| . | . | . | . | . |  | . |
| Meter k | $C_{k1}$ | $C_{k2}$ | $C_{k3}$ | $C_{k4}$ | ... | 1 |

Returning to FIG. 9, a list of meters is developed for each level of the hierarchy under consideration. The top-most level is assumed to be the meter with the largest power reading, which is assumed to be a main. Once that meter is found in the Data Table (408), the algorithm 400 places the main in a feeder level list of the hierarchy and clears the list of monitoring devices on the current feeder level in the hierarchy (410). In subsequent iterations through the MAIN LOOP, the algorithm 400 places the reference meter in the previous feeder level list of the hierarchy. It should be understood that on the first iteration, there is no previous level list. The algorithm 400 clears a Correlation Reference Array (CRA) (412), and designates the main as the reference monitoring device (414). An exemplary CRA is shown in Table 4, below, for n iterations for a given feeder level. $C_{51}$ corresponds to the correlation coefficient between meter 5 (the reference meter) and meter 1, $C_{52}$ corresponds to the correlation coefficient between meter 5 and meter 2, and so forth. Initially, the CRA is cleared for each feeder level, and the algorithm 400 develops a new CRA for each feeder level by populating each iteration column with correlation coefficients for all meters on the current feeder level. A specific example is explained in connection with Table 5 below.

The Correlation Coefficient Matrix (CCM) is calculated based on the power data (416). In the first iteration, the only known element in the hierarchy is the main, and the hierarchy is auto-learned from the top-most feeder level down, in accordance with some or all of the assumptions or parameters listed above.

TABLE 4

Correlation Reference Array (CRA) Example

| Iteration 1 | Iteration 2 | Iteration 3 | Iteration 4 | Iteration 5 | ... | Iteration n |
|---|---|---|---|---|---|---|
| $C_{51}$ | $C_{51}$ | $C_{51}$ | $C_{51}$ | $C_{51}$ | ... | $C_{51}$ |
| $C_{52}$ | $C_{52}$ | $C_{52}$ | $C_{52}$ | $C_{52}$ | ... | $C_{52}$ |
| $C_{53}$ | $C_{53}$ | $C_{53}$ | $C_{53}$ | $C_{53}$ | ... | $C_{53}$ |
| $C_{54}$ | $C_{54}$ | $C_{54}$ | $C_{54}$ | $C_{54}$ | ... | $C_{54}$ |
| ... | ... | ... | ... | ... | ... | ... |
| $C_{5m}$ | $C_{5m}$ | $C_{5m}$ | $C_{5m}$ | $C_{5m}$ | ... | $C_{5m}$ |

Continuing with FIG. 10, the algorithm 400 zeros the correlation coefficients in the CCM for meters that have zeros in the Check Matrix and meters that have already been found to be connected (418). The column for the reference monitoring device is copied from the CCM to the CRA (420). A specific example will be explained next in connection with Table 5 below. Assume that meter 5 in the CCM is designated as the reference meter (414). The algorithm 400 calculates the CCM based on the Data Table (416) and zeroes the correlation coefficient(s) in the CCM for meters that have zero in the Check Matrix and meters that have been found to be connected (418). The column in the CCM corresponding to meter 5 is copied into the column Iteration 1 of the CRA. Referring to Table 5, meter 11 has the highest correlation with meter 5 of 0.649, and meter 11 is marked as connected with meter 5 for the current feeder level.

In Iteration 2, meter 11's power is subtracted from meter 5's power in the is data table, and the meter 5-11 correlation coefficient drops to −0.048 in Iteration 2, which provides a high degree of confidence that meter 11 is interrelated with meter 5. Also noteworthy is that some meter's correlation coefficients trend higher as the iterations progress. For example, the correlation coefficients for meter 18 relative to meter 5 gradually increase from 0.296 in Iteration 1 to 0.417 in Iteration 2 to 0.436 in Iteration 3 to 0.525 in Iteration 4 and finally to 0.671 in Iteration 5, which is the highest correlation coefficient among all the meters (meter 5 correlated with itself is always 1.0, so its correlation coefficient is ignored). This increasing trend also provides a high degree of confidence that meter 18 is also directly linked with meter 5, and this link is finally confirmed in Iteration 5. The same increasing trends can be observed for meters 12 and 15, for example. In Iteration 7, none of the correlation coefficients exceed a threshold, and the algorithm 400 proceeds to analyze the next feeder level. By Iteration 7, the algorithm 400 has determined that meters 11, 12, 14, 15, 18, and 20 are directly linked with meter 5.

TABLE 5

CRA Example With Exemplary Correlation Coefficients

|      | Iteration 1 | Iteration 2 | Iteration 3 | Iteration 4 | Iteration 5 | Iteration 6 | Iteration 7 |
|------|-------------|-------------|-------------|-------------|-------------|-------------|-------------|
| 5-1  | 0.020       | −0.029      | 0.010       | 0.016       | −0.037      | −0.004      | 0.007       |
| 5-2  | 0.043       | −0.020      | −0.037      | −0.009      | −0.095      | −0.091      | −0.099      |
| 5-3  | 0.067       | 0.079       | 0.017       | 0.024       | −0.052      | −0.046      | −0.009      |
| 5-4  | 0.018       | −0.024      | −0.038      | −0.018      | 0.037       | 0.015       | 0.037       |
| 5-5  | 1.000       | 1.000       | 1.000       | 1.000       | 1.000       | 1.000       | 1.000       |
| 5-6  | 0.058       | 0.022       | −0.016      | −0.015      | −0.035      | −0.010      | 0.029       |
| 5-7  | −0.042      | −0.005      | 0.001       | 0.054       | 0.033       | 0.026       | 0.031       |
| 5-8  | −0.034      | −0.016      | −0.057      | −0.058      | 0.005       | −0.034      | −0.049      |
| 5-9  | 0.418       | 0.386       | 0.308       | 0.292       | 0.189       | 0.099       | 0.136       |
| 5-10 | 0.022       | 0.077       | 0.016       | 0.014       | −0.016      | −0.018      | 0.022       |
| 5-11 | 0.649       | −0.048      | −0.090      | −0.095      | −0.076      | −0.077      | −0.014      |
| 5-12 | 0.344       | 0.506       | 0.628       | 0.725       | 0.047       | −0.007      | 0.016       |
| 5-13 | −0.038      | −0.036      | 0.038       | 0.017       | −0.046      | −0.023      | −0.010      |
| 5-14 | 0.483       | 0.591       | 0.072       | 0.044       | 0.066       | −0.006      | 0.004       |
| 5-15 | 0.043       | 0.161       | 0.210       | 0.263       | 0.417       | 0.587       | 0.031       |
| 5-16 | 0.024       | 0.045       | 0.055       | 0.044       | −0.017      | −0.010      | 0.022       |
| 5-17 | −0.057      | −0.063      | −0.101      | −0.090      | −0.061      | −0.048      | −0.049      |
| 5-18 | 0.296       | 0.417       | 0.436       | 0.525       | 0.671       | 0.113       | 0.165       |
| 5-19 | −0.046      | −0.053      | −0.057      | −0.047      | −0.046      | −0.050      | −0.034      |
| 5-20 | 0.398       | 0.549       | 0.633       | 0.128       | 0.069       | 0.054       | 0.061       |
| 5-21 | −0.060      | −0.017      | 0.028       | 0.080       | −0.013      | 0.010       | 0.005       |

Still referring to FIG. 10, the algorithm 400 finds the monitoring device (feeder) in the CRA that has the highest correlation with the reference monitoring device (422). If the correlation does not exceed a threshold (0.5 in a preferred embodiment), the algorithm 400 continues to FIG. 11a (OP3), such as in the case of Iteration 7 in Table 5 shown above.

Otherwise, the algorithm 400 determines whether the current iteration is the first iteration for the reference monitoring device (426), and if not, determines whether the feeder correlation is trending higher (428). If the feeder correlation is not trending higher, the algorithm 400 continues to FIG. 11a (OP3). A higher trend is an indication that the monitoring device is likely on the current level of the hierarchy under consideration.

If the current iteration is the first iteration for the reference monitoring device, the feeder is added to the list of monitoring devices on the current level of the hierarchy (430), and the algorithm 400 continues to FIG. 11a (OP2). The reference monitoring device and the feeder are designated as directly linked (or interrelated) in a connection table (446), and the power associated with the feeder is subtracted from the reference monitoring device in the data table (448). The connection table maintains a list of devices and their interrelationships (for example, whether they are directly linked). By subtracting the power of the feeder associated with the highest correlation coefficient is relative to the reference monitoring device, other feeders (monitoring devices) connected to the reference monitoring device will see their correlation coefficients increase. The algorithm 400 returns to the FEEDER LOOP of FIG. 9, and the next iteration continues with the remaining monitoring devices.

Turning now to the OP3 function, the algorithm 400 determines whether all monitoring devices on the previous level have been analyzed (432), and if not, the next monitoring device (feeder) is obtained on the previous level, and the algorithm 400 returns to the FEEDER LOOP of FIG. 9. If all monitoring devices on the previous level have been analyzed, the algorithm 400 checks whether a connection has been found for all monitoring devices in the hierarchy (434). If so, the algorithm 400 exits. If not, the algorithm 400 checks whether the highest correlation coefficient in the CCM exceeds a threshold (436). If not, the algorithm 400 exits. If so, the algorithm 400 determines whether any more monitoring devices are found for the current level (438). If not, the algorithm 400 returns to the MAIN LOOP in FIG. 9. If so, the algorithm moves the monitoring devices on the current level to the previous level (440) and clears the CRA (442). The algorithm returns to the FEEDER LOOP of FIG. 9 to determine the relationships among the remaining monitoring devices on the current level.

Figure 11B:
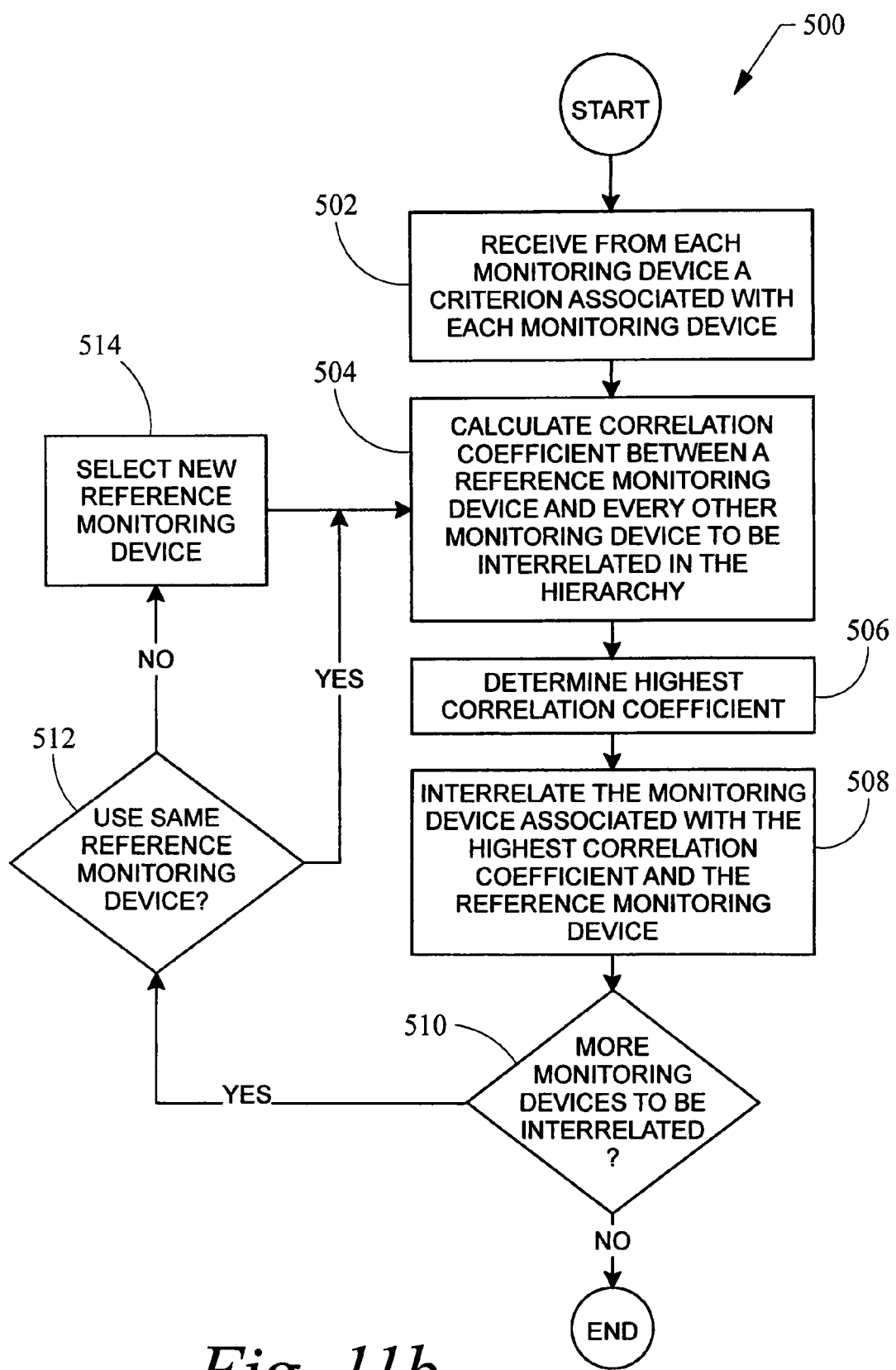
FIG. 11b is a flow chart diagram of an auto-learned hierarchy algorithm in accordance with another embodiment of the present invention.

An auto-learned hierarchy algorithm 500 according to another embodiment of the present invention is illustrated in FIG. 11b. The algorithm 500 starts by receiving from each monitoring device a criterion associated with each monitoring device (502). The criterion can be an electrical parameter, such as power, voltage, current, current distortion, voltage distortion, or energy, or a parameter associated with any WAGES utility, such as volume (BTU, MBTU, gallons, cubic feet) per unit time. The monitoring devices can be power monitoring devices. For example, when the criterion is a voltage distortion, monitoring devices on the same level of the hierarchy will have roughly the same voltage distortion. Additionally or alternatively, the algorithm can use the harmonic distortion values to verify the hierarchy determined by the correlations based on power criteria. Harmonic distortion can also be used by the algorithm to better predict unknown candidates with greater accuracy. For example, a monitoring device may be marginally correlated with a reference device such that the algorithm cannot determine whether a direct link exists or not. Harmonic distortion can rule in or rule out a potential interrelationship depending upon the harmonic distortion values of the neighboring devices on the same level as the monitoring device in question. For example, a different harmonic distortion returned for the monitoring device in question could rule it out as being directly linked with a device on the previous level.

The algorithm 500 calculates a correlation coefficient between a reference monitoring device and every other monitoring device to be interrelated in the hierarchy (504). The algorithm 500 determines the highest correlation coefficient (506) and interrelates the monitoring device associated with the highest correlation coefficient and the reference monitoring device (508). The algorithm 500 checks whether more monitoring devices are to be interrelated (510), and if not, the algorithm 500 ends. If so, the algorithm 500 checks whether to use the same reference monitoring device (512), and if so, recalculates the correlation coefficients (504). Otherwise, the algorithm 500 selects a new reference monitoring device (514), and recalculates the correlation coefficients (504).

Figure 11C:
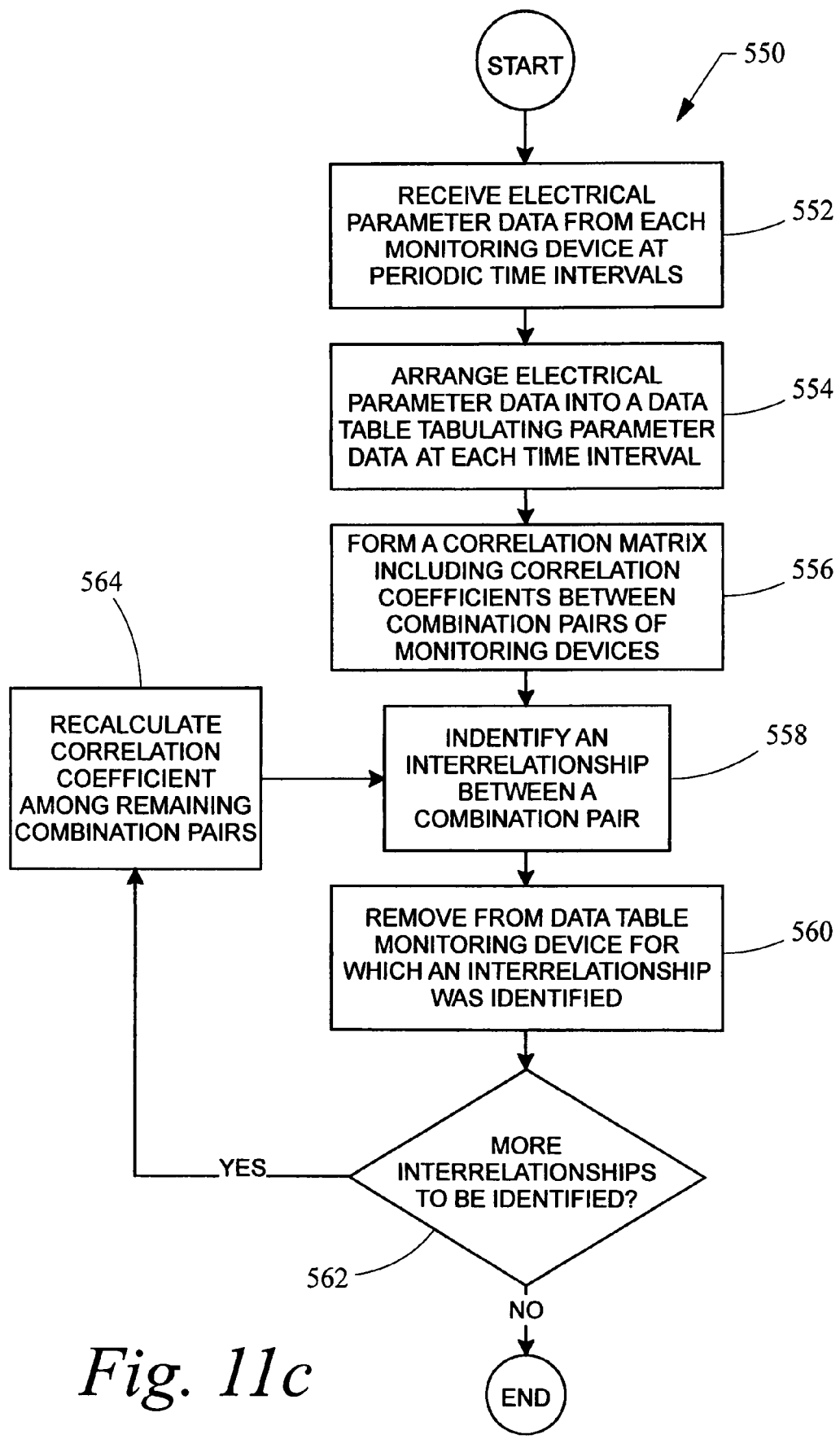
FIG. 11c is a flow chart diagram of an auto-learned hierarchy algorithm in accordance with still another embodiment of the present invention.

An auto-learned hierarchy algorithm 550 according to still another embodiment of the present invention is illustrated in FIG. 11c. The algorithm 550 starts by receiving electrical parameter data from each monitoring device at periodic time intervals (552). The algorithm 550 arranges the electrical parameter data into a data table that tabulates the parameter data at each time interval (554). A correlation matrix is formed that includes correlation coefficients between combination pairs of monitoring devices (556). The algorithm 550 identifies an interrelationship between a combination pair (558) and removes from the data table the power associated with the monitoring device for which an interrelationship was identified (560). If no more interrelationships are to be identified (562), the algorithm 550 ends. Otherwise, it recalculates correlation coefficients among the remaining combination pairs (564) and identifies another interrelationship between the remaining combination pairs (558). This process is repeated until all interrelationships among the monitoring devices have been identified.

The auto-learned hierarchy algorithm according to the various embodiments of the present invention is operable in both radial-fed and multiple radial-fed systems. In multiple radial-fed systems, the algorithm first determines the main meter having the highest power, then determines the hierarchy for that system first before proceeding to the next system (s) having lower power ratings.

The auto-learned hierarchy algorithm has been discussed in various embodiments in which the hierarchy is developed from the top-most level towards the bottom-most level. In an alternate embodiment, an auto-learned hierarchy algorithm develops a hierarchy from the bottom-most level based on events local to each level. For example, monitoring devices proximate to an event will 'see' an event, such as a load turning on or off, before monitoring devices remote from the event will see it. The algorithm recognizes interrelationships among monitoring devices based on the occurrences of events and the timestamps associated with each monitoring device as to when it became aware of an event. By mapping out a chronology of when each monitoring device in the system perceives an event, conclusions can be automatically drawn based upon the time order in which monitoring device perceived that event as to which meters are interrelated (directly linked).

Referring back to FIG. 1, the automated data integrated monitoring system 100 produces contextual data 108 from the data alignment system 104 and the hierarchy classification system 106. The contextual data 108 contains the data from each monitoring device in context with every other monitoring device and is thus more valuable to the user. Contextual analysis of the measured data can be performed, which involves an assessment of the data such that specific external parameters from each monitoring device are aligned or are made known. The primary external parameters of concern include:

The temporal position of each monitoring device's data in the utility system 102 relative to every other monitoring device's data in the utility system 102; and The spatial position of each monitoring device M in the utility system 102 with respect to every other monitoring device M in the utility system 102.

Evaluating all the monitoring data accumulated from the utility system 102 in context will provide a degree of knowledge about the utility system 102 that heretofore was unavailable. Because the information from the entire system (software and monitoring devices) is integrated together through a uniform context, this approach to monitoring a utility system is referred to as Integrated Monitoring (IM).

A useful analogy of the IM approach according to the present invention is the central nervous system of the human body. The brain (software) knows what is going on with the entire body (the monitoring devices) relative to time and position. If a toe is stubbed, the brain sends a signal for the body to react in some manner. Similarly if an electrical event occurs, the IM algorithms executed by the monitoring system software provides useful information to the user on the symptoms throughout the monitored system, potential sources of the problem, and possible solutions or recommendations.

The present invention involves integrating data based on analysis of the data from each monitoring point using special algorithms (for example, a data alignment algorithm and an auto-learned hierarchy algorithm) in the monitoring system software. In the data alignment system 104, subtle but measurable changes in the data's frequency and amplitude are analyzed from all data sources. These changes are used to establish both the common point of data alignment for all data sources and a data source's position in the electrical system with respect to other data sources. Because the process of integrating the system data is performed automatically on algorithms in the monitoring system software, much of the effort and expense required by the user is eliminated. More arbitrary and substantial variations of the parameters being analyzed offers quicker integration of the system data.

There are several benefits associated with IM that are beyond what is presently available including:

The automated IM approach greatly reduces the existing requirements for the user to manually provide detailed information about the power system layout in order to put the system data into context. The IM algorithms analyze data from each monitoring point in the electrical system to automatically determine the system layout with little or no user involvement, saving the user time and resources.

The automated IM approach eliminates the need for special hardware, additional data lines, and, in some cases, monitor accessories. The IM algorithms analyze data from each monitoring point in the electrical system to automatically determine the temporal alignment of the system data, saving the user equipment and labor costs.

The automated IM approach allows an easier configuration of monitoring hardware and software. This is because the IM algorithms automatically put the monitoring information into context throughout the system. Once the monitoring devices are in context, additional decisions regarding hardware and software configuration can automatically be made by the IM algorithms. One example would be setting a monitoring device's under-voltage threshold depending on the monitoring device's location within the electrical system. Again, the automated IM approach saves the user time and resources.

Figure 12:
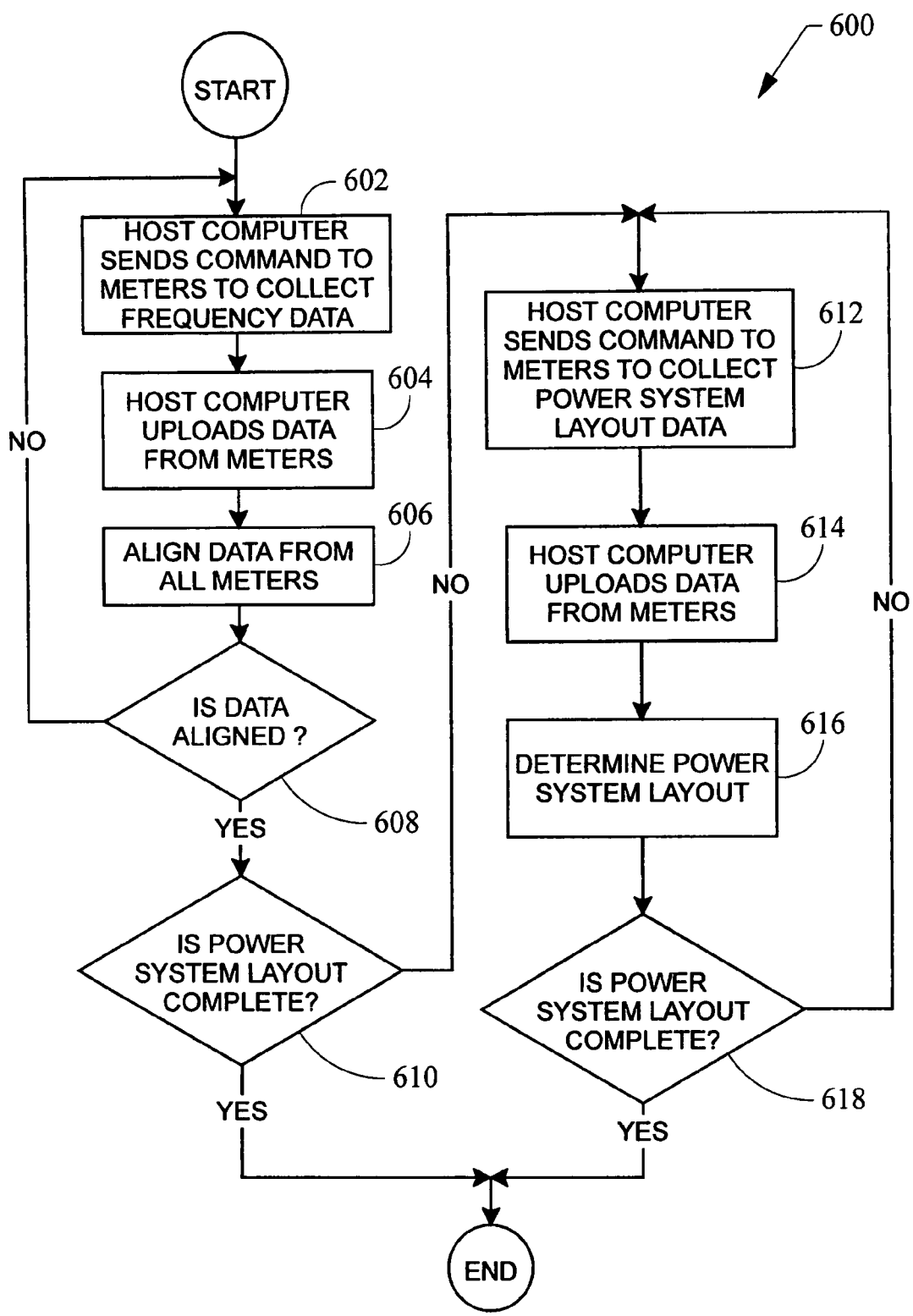
FIG. 12 is a flow chart diagram of an automated integrated monitoring algorithm in accordance with an embodiment of the present invention.

An automated IM algorithm 600 according to an embodiment of the present invention is illustrated in FIG. 12. The algorithm 600 starts by sending a command to the monitoring devices to collect frequency data (602). Data from the monitoring devices is uploaded to the host computer (604) and the data from all the monitoring devices is aligned (606) in accordance with the present invention. When all the data is aligned, the algorithm 600 determines whether the power system layout is complete (610). If so, the algorithm 600 ends, and the contextual data can be used in further software applications.

If the power system layout is not complete, the algorithm 600 sends a command to the monitoring devices to collect power data (612). The host computer running the algorithm 600 uploads the power data from monitoring devices (614) and determines the power system layout (616) in accordance with the present invention. This procedure is repeated until the power system layout is complete (618) at which point the algorithm ends.

Additional data may be collected by the monitoring device 128 relating to measured contextual harmonic distortion data. The data relating to harmonic distortion data is evaluated with respect to harmonic distortion data from other monitoring devices such as the monitoring device 130 in FIG. 2 to alert a user to potential harmonic distortion concerns that exist in the utility system 102. Various aspects of the non-fundamental frequency data from the utility system 102 are preferably evaluated from each monitoring device within an established temporal and spatial context as explained above. Alternatively, the data may be placed in pseudo-temporal context since harmonic distortions are generally steady state and thus precise temporal alignment is not necessary unless the loads in the system are changing rapidly. Some of the harmonic distortion characteristics/data that are measured and evaluated include: 1) total voltage harmonic distortion; 2) total current harmonic distortion; 3) discrete harmonic component magnitudes and angles (voltages, currents, and powers); 4) discrete harmonic component flow directions; 5) discrete interharmonic component magnitudes (voltages, is currents, and powers); 6) discrete interharmonic component flow directions; 7) affected phase(s) (A,B,C); 8) total even harmonic distortion (2nd, 4th, 6th, 8th, 10th, 12th, . . . harmonic components) and total odd harmonic distortion (3rd, 5th, 7th, 9th, 11th, 13th, . . . harmonic components); 9) triplens (3rd, 6th, 9th, 12th, 15th, 18th, . . . harmonic components); 10) harmonic distortion associated with three-phase rectifiers (5th, 7th, 11th, 13th, 17th, 19th . . . harmonic components); 11) harmonic distortion associated with positive sequence components (4th, 7th, 10th, 13th, 16th, 19th, . . . harmonic components); 12) harmonic distortion associated with negative sequence components (2nd, 5th, 8th, 11th, 14th, 17th, . . . harmonic components); 13) harmonic distortion associated with zero-sequence components (3rd, 6th, 9th, 12th, 15th, 18th, . . . harmonic components); 14) true power factor versus displacement power factor; 15) crest factors; 16) total demand distortion; and 17) neutral current magnitudes, angles and frequency components.

An evaluation is performed on measured harmonic distortion data comparing it against thresholds established by the end-user or based on default thresholds (or both) at the computer 132. The default thresholds are based on those recommended limits in the appropriate IEC and/or IEEE standards (or by some other default configuration by the manufacturer or user). By pooling the harmonic distortion data from multiple monitoring devices, many evaluations are performed by the computer 132 that provide higher quality information to the end-user than previously available from a single power monitoring device. Some of the evaluations that may be performed by a multiple-metered system that is in context both spatially and temporally (or pseudo-temporally) may include: 1) locations of harmonic distortion source "hot spots" (both primary and secondary severity); 2) harmonic distortion sink "hot spots" (i.e., where the harmonic components are flowing to); 3) harmonic distortion current "hot spots" on the neutral conductors; 4) impact of discrete loads on the entire monitored electrical system as they relate to harmonic distortion; 5) impact of processes on the entire monitored electrical system as they relate to harmonic distortion; 6) optimal locations for harmonic distortion mitigation devices, harmonic-rated transformers and supplemental neutral current conductor runs; 7) propagation of harmonic components through the entire monitored electrical system; 8) trends in patterns of harmonic component magnitudes throughout the entire monitored electrical system; 9) effects and return-on-investment is (ROI) of mitigation devices on harmonic component trends in the entire monitored electrical system; 10) location of potentially damaged power electronic-based devices; 11) locations of adjustable speed drives that inject higher levels of harmonic distortion components into the electrical power system; 12) potential capacitor bank issues; 13) redundant verification of harmonic power flows to or from the utility; 14) trending of discrete harmonic distortion component magnitudes and directions from a system perspective; and 15) virtual harmonic distortion monitoring of both discrete and total harmonic distortion components.

Figure 13A:
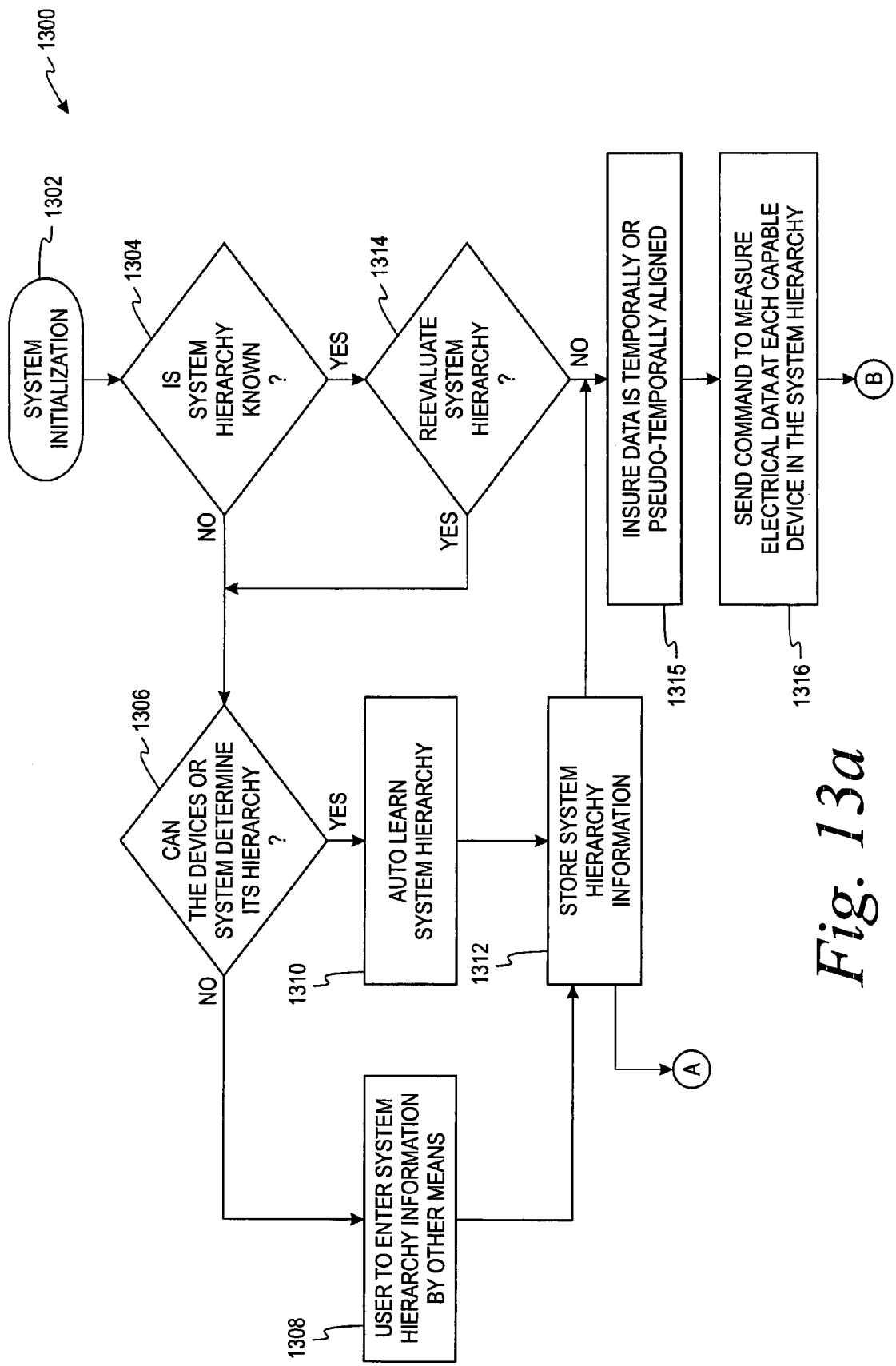
FIGS. 13a-13b are a flow chart diagram of a harmonic distortion detection and evaluation algorithm.
Figure 13B:
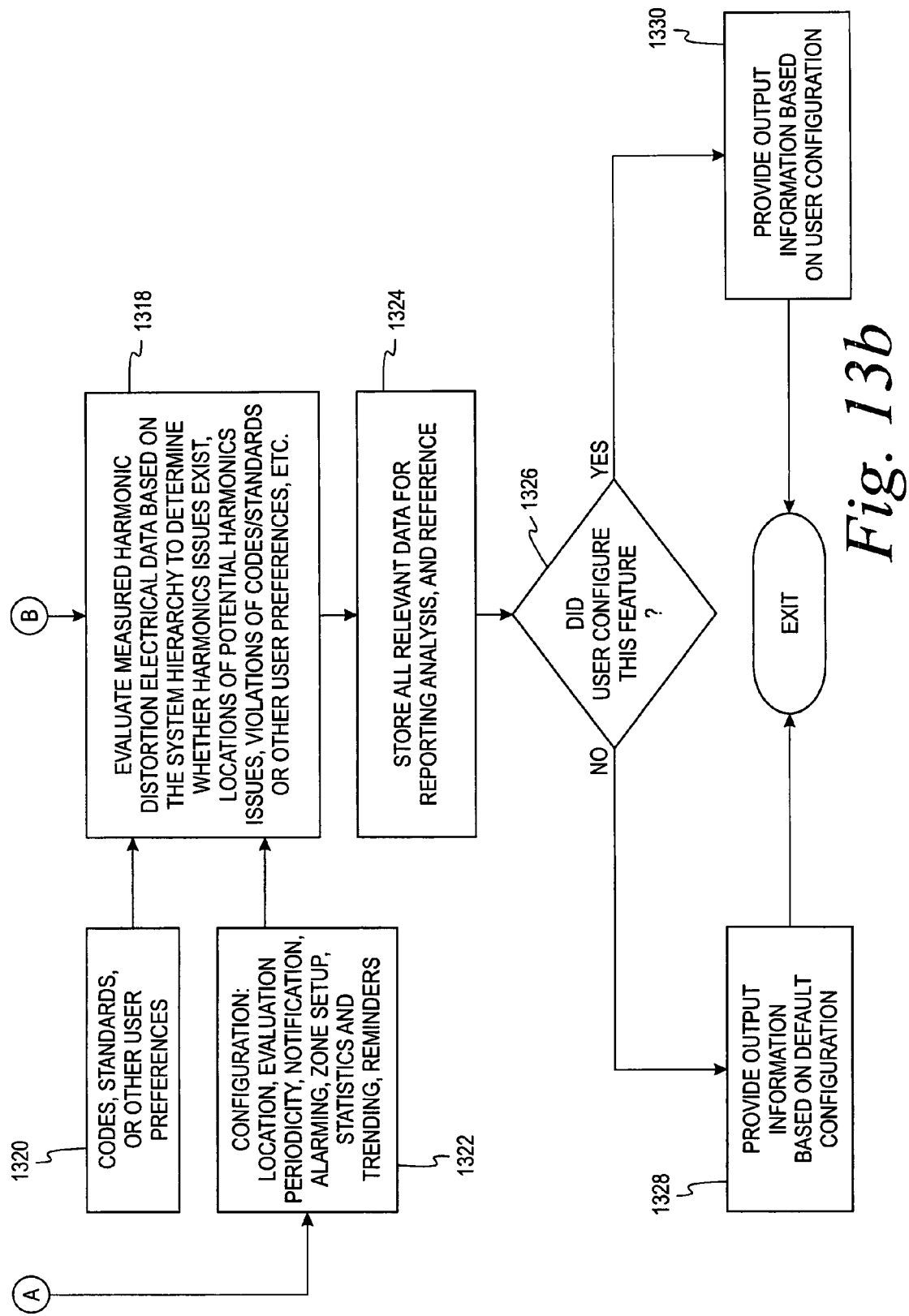

An example flow diagram 1300 of an algorithm for processing and evaluating harmonic distortion data is shown in FIGS. 13*a*-13*b*. The algorithm may be incorporated in the software applications 110 in FIG. 1 or a separate application. Data from the monitoring devices such as the monitoring device 128 in FIG. 2 is evaluated to determine harmonic distortion issues as will be explained below. Such data may include voltages, currents, powers, and/or their associated frequency components, or some combination or permutation thereof as discussed above to obtain the characteristics of harmonic distortion. It is possible to segment the hierarchy of the utility system 102 into zones or specific areas as determined by the above described hierarchy algorithm or as configured by the end-user. It is possible to trigger an alarm and/or otherwise notify the end-user by some means when any predefined (either by the user or by the system) threshold has been exceeded indicating a severe harmonic distortion effect. Statistical methods that may be incorporated with the thresholds to analyze the data include (but are not limited to) correlations, averages, min/max, trending & forecasting, standard deviations, etc. Reminders/notices may include (but are not limited to) notifying the user of updated firmware, updated codes, updated standards, updated preferences, changes in the system, hierarchy, disregarded alarms, or any other consideration as it relates to harmonic distortion evalautions and the user's power system.

Specifically, the algorithm initalizes itself (1302). The algorithm determines whether the hierarchy of the electrical system such as the utility system 102 is known (1304). If the hierarchy is not known, the alogrithm determines whether the automated hierarchy algorithm such as that described above with reference to FIGS. 9, 10, and 11*a* is installed (1306). If the algorithm cannot automatically learn the hierarchy of the system, the user will be prompted to enter the system hierarchy such as by is providing an electronic file of the system hierarchy (1308). If the automated hierarchy algorithm in FIGS. 9, 10 and 11*a* is present, the algorithm will automatically learn the hierarchy of the system from the automated hierarchy algorithm (1310). Either the user entered hierarchy or the automatically determined hierachy is stored for access by the algorithm (1312). The data may also be incorporated to update a configuration file 1322 by replacing or supplementing the existing data. If the system hierarchy is known (1304), the algorithm determines whether the known system hierarchy needs to be reevaluated (1314). This is done by determining whether new components have been added or other alterations have been made to the electrical system, changing the system hierarchy. If a reevaluation is necessary, the algorithm loops back to block 1306 to determine the new hierarchy.

After the hierarchy is stored (1312), the algorithm insures that the data is either temporally or pseudo-temporally aligned if needed (1315). The data may be placed in a temporal context by the methods as described above. Alternatively, the data may be placed in a pseudo-temporal context. The temporal or pseudo-temporal alignment may not be needed if the monitoring devices have already been temporally or pseudo-temporally aligned. The algorithm sends commands to all monitoring devices in the system to measure electrical data relating to harmonic distortion (1316). After the monitoring devices have measured the electrical data, the data is placed in a spatial context based on the stored system hierarchy. The aligned data in the spatial context and the temporal or pseudo-temporal context is evaluated to determine whether harmonic distortion issues exist (1318). As part of the evaluation, different subroutines may be called to determine harmonic distortion information based on the electrical measurements. In order to perform the different evaluation subroutines, the algorithm has access to a database 1320 which stores codes, standards and other user preferences. The algorithm also has access to configuration data such as location, evaluation periodicity, notification, alarming, zone setup, statistics and trending reminders which are stored in a configuration file 1322. After the evaluation of the harmonic distortion is completed the relevant data is stored for reporting, analysis and future reference in the computer 132 in FIG. 2 (1324).

After storing the evaluated data, the algorithm determines whether the user configured the reporting requirements and output for the analyzed data (1326). If the user has not configured the reporting requirements and output configuration, the algorithm provides the evaluation information in default configuration reports (1328) and ends. If the user has configured the reporting requirements, the output information is configured according to the user configuration (1330) and the algorithm ends.

Figure 14A:
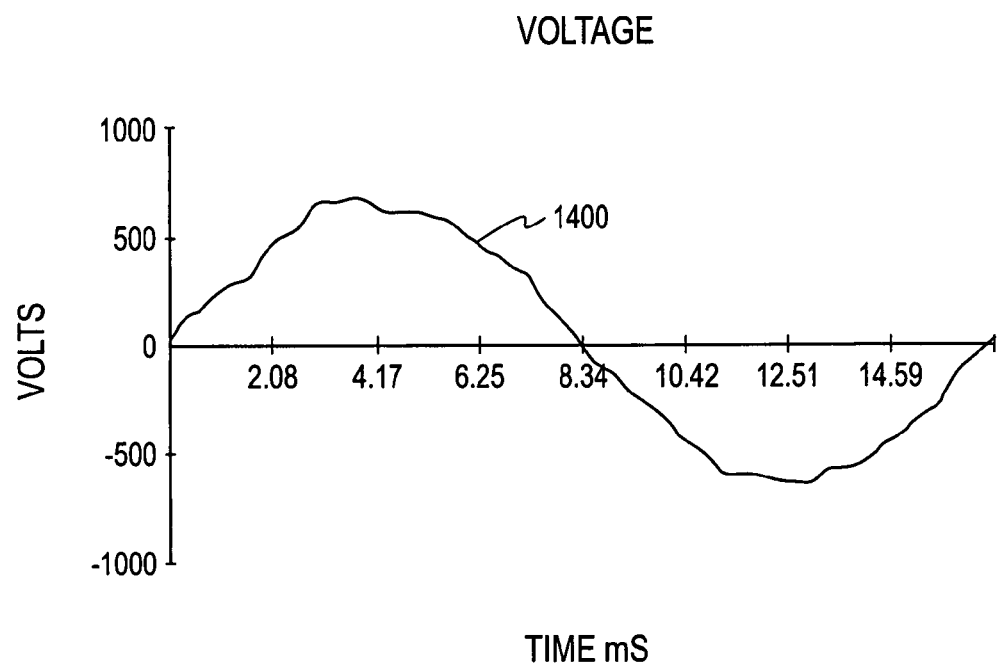
FIGS. 14a-14b are exemplary voltage signals in the time and frequency domain, respectively, including harmonic distortion measured by the power monitoring system in FIG. 2 for an example rectifier based device.
Figure 14B:
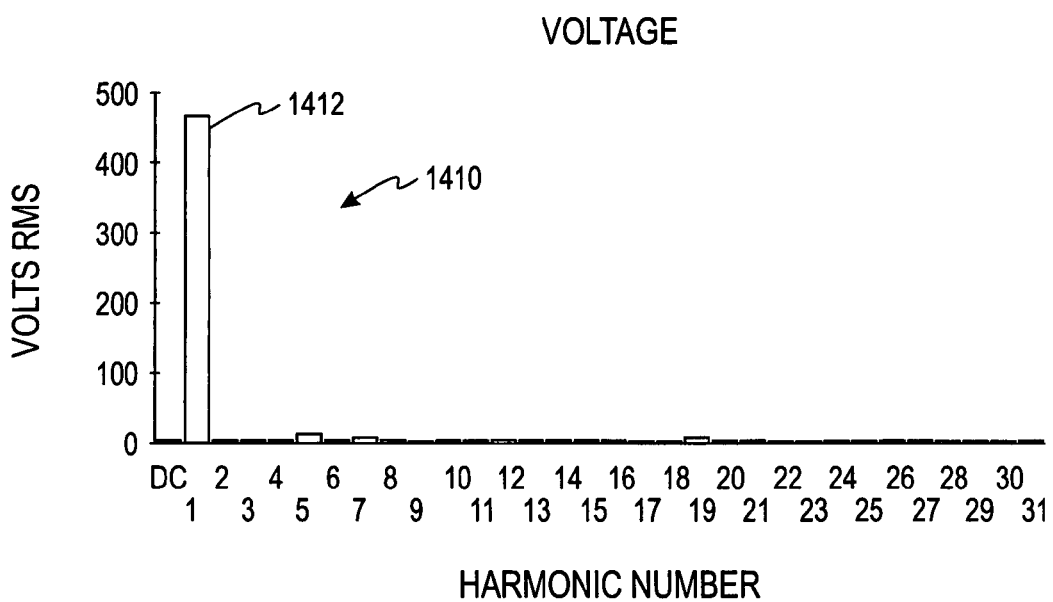
Figure 15A:
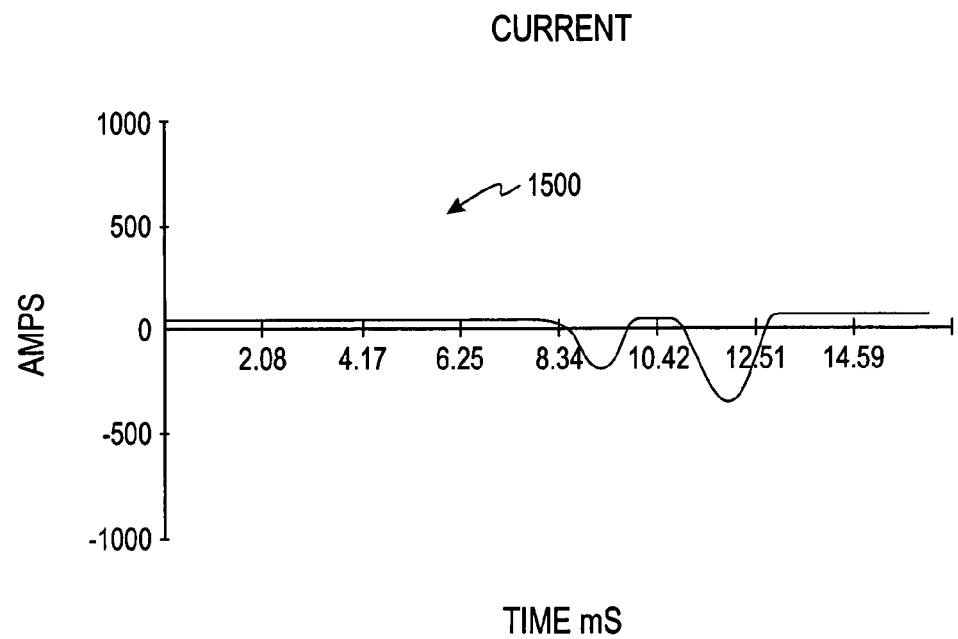
FIGS. 15a-15b are exemplary current signals in the time and frequency domain, respectively, including harmonic distortion measured by the power monitoring system in FIG. 2 for the example rectifier based device.
Figure 15B:
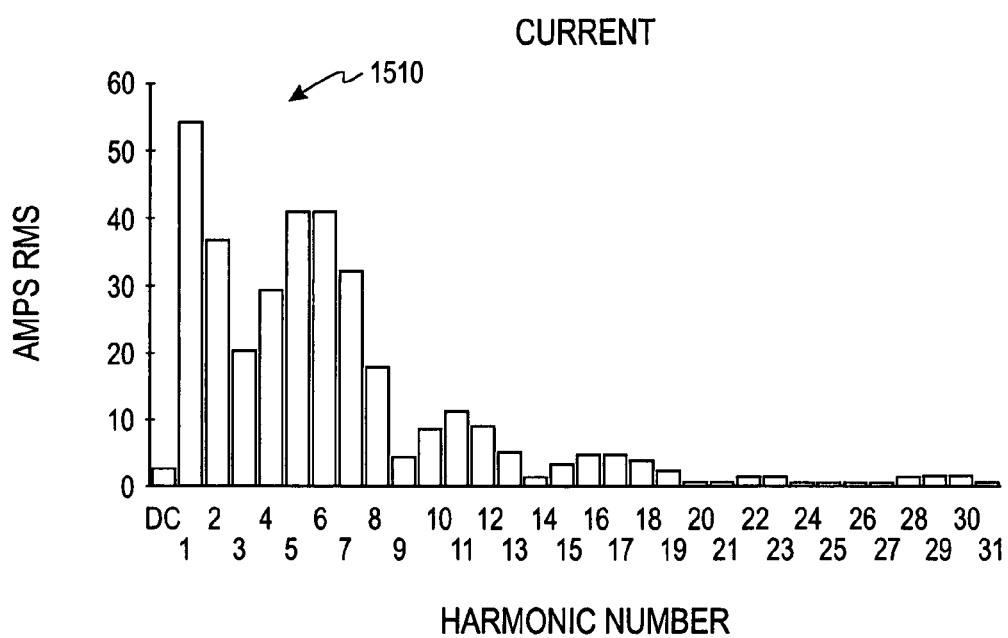
Figure 16:
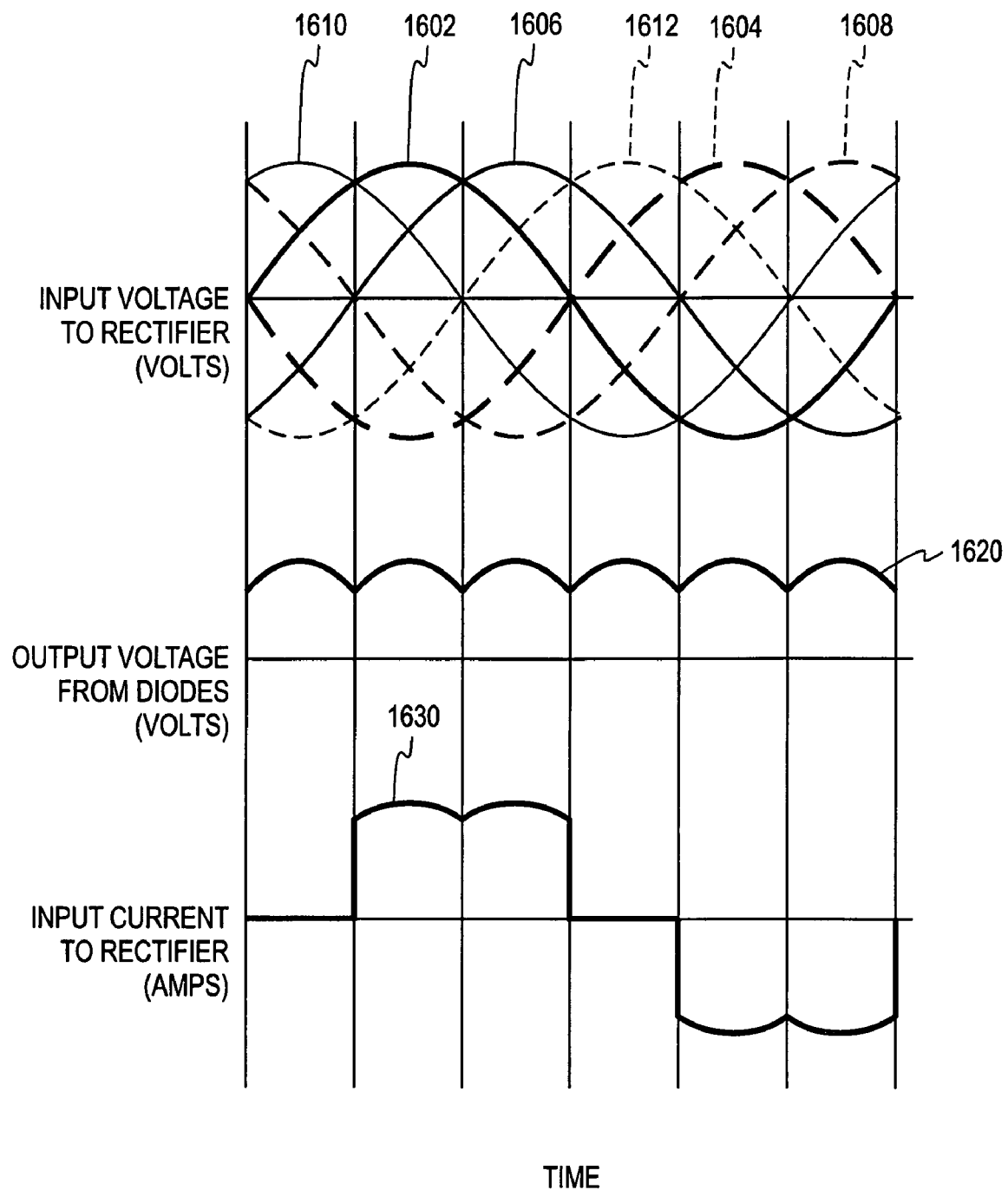
FIG. 16 is an exemplary ideal voltage and current signal waveforms of the input voltage, output of the three-phase bridge rectifier, and input (load) current of one phase for the example rectifier-based device measured in FIGS. 14-15.

Example data indicative of harmonic distortion from a monitoring device such as the monitor 128 in FIG. 2 may be seen in FIGS. 14*a*-14*b* and FIGS. 15*a*-15*b*. FIG. 14*a* and FIG. 15*a* are voltage and current diagrams in the time domain from the input of one of the phases of the three-phase bridge rectifier of an adjustable speed drive which may be taken from a monitoring device or devices in the power monitoring system 120 in FIG. 2. FIG. 14*a* shows a voltage waveform 1400 which exhibits significant distortion due to even harmonic component distortion occurring in the power monitoring system 120 in FIG. 2. FIG. 15*a* shows a current waveform 1500 of the rectifier and substantiates the fact that a problem exists with the rectifier since rather than a linear current output, due to the even harmonic component distortion being present when only negative current flow occurs. FIG. 16 illustrates different voltage and current waveforms and conduction times of diodes in a three-phase bridge rectifier. The top graph in FIG. 16 illustrates both the waveforms for three-phase input voltages 1602, 1606 and 1610 to a rectifier (shown in solid lines) and the opposite polarity of those respective waveforms 1604, 1608 and 1612 (dotted lines). As the instantaneous values of the three-phase voltages vary, only the diode pair having the greatest amount of instantaneous line-to-line voltage will conduct. The labels at the top of FIG. 16 illustrate the conduction sequence of the diodes with respect to the line voltages. For example in this waveform, diode #6 begins conducting at 0° and stops conducting at 120°, diode #1 begins conducting at 60° and stops conducting at 180°, diode #2 begins conducting at 120° and stops conducting at 240°, and so forth. The result is a dc voltage with a superimposed ripple frequency equal to six times the fundamental frequency on an output voltage waveform 1620 of the bridge rectifier as shown as the middle graph in FIG. 16. The three-phase bridge rectifier's input current waveform 1630 is shown in the bottom graph in FIG. 16. The input current waveform 1630 illustrates the expected current flow on the A-phase conductor based on the conduction sequence described above.

The monitoring devices such as the monitoring device 128 in FIG. 2 detect the initial current and voltage waveforms. The device firmware 136 analyzes both the current and voltage signals using Fourier analysis to determine the magnitude and angles of discrete harmonic distortion components. Alternatively, other filtering techniques such as such as Goertzel filters or hardware filters could be used. The voltage and current magnitude of the discrete harmonic distortion components may be expressed in volts/amperes, percentage of the root-mean square (rms), or percentage of the fundamental. FIG. 14*b* is a graph illustrating the frequency domain of the voltage signal 1410 showing the root-mean squared (rms) voltage values of each harmonic component. The fundamental frequency component (e.g., the $1^{st}$ harmonic) 1412 is the greatest magnitude of voltage. FIG. 15*b* is a graph illustrating the frequency domain of the current signal 1510 showing the rms current values of each harmonic component. As may be seen by FIG. 15*b*, the even harmonic current components have significant magnitudes, which is uncharacteristic for three-phase rectifiers. The significant level of even current harmonic components (as a percentage of the total signal) shown in FIG. 15*b* generally indicates the asymmetrical operation of a non-linear device such as a damaged diode or thyristor on a three-phase rectifier. Data from the time and frequency domain is analyzed to derive characteristics of the harmonic distortion issues and assign contextual (location and time) data to said characteristics.

The algorithm in FIGS. 13*a*-13*b* is employed to determine the existence, severity and location of a harmonic distortion within the utility system 102 based on the harmonic distortion characteristics, the data 108 relating to the system hierarchy and the temporal or pseudo-temporal data. The algorithm in FIGS. 13*a*-13*b* may access different subroutines to perform these and other different functions. The algorithm in FIGS. 13*a*-13*b* allows immediate notification of the end-user to remedy the situation.

An example of the resulting data from systemic harmonic distortion analysis from subroutines of the software applications 110 in FIG. 1 are shown in example power system models in FIGS. 17*a*-17*d*. The data in the power system models in FIGS. 17*a*-17*d* may be displayed in a graphical or other format to a user on the computer 132. Data may also be sent out to specific installed monitoring devices for the user to view in the field. The exemplary power system models in FIGS. 17*a*-17*d* may also be part of the user interface 112 in FIG. 1. The power system models in FIGS. 17*a*-17*d* may be selected by a user based on the harmonic distortion data evaluation performed by the algorithm. It is to be understood that the algorithm may perform all the different analyses outlined in FIGS. 13*a*-13*b* simultaneously or as needed. The algorithm may also incorporate the automated hierarchy algorithm described in connection with FIGS. 9, 10, and 11*a* as well as ensuring the data is pseudo-temporally or temporally aligned. Of course, it is to be understood the harmonic distortion-related data may be analyzed and displayed for other purposes.

Figure 17A:
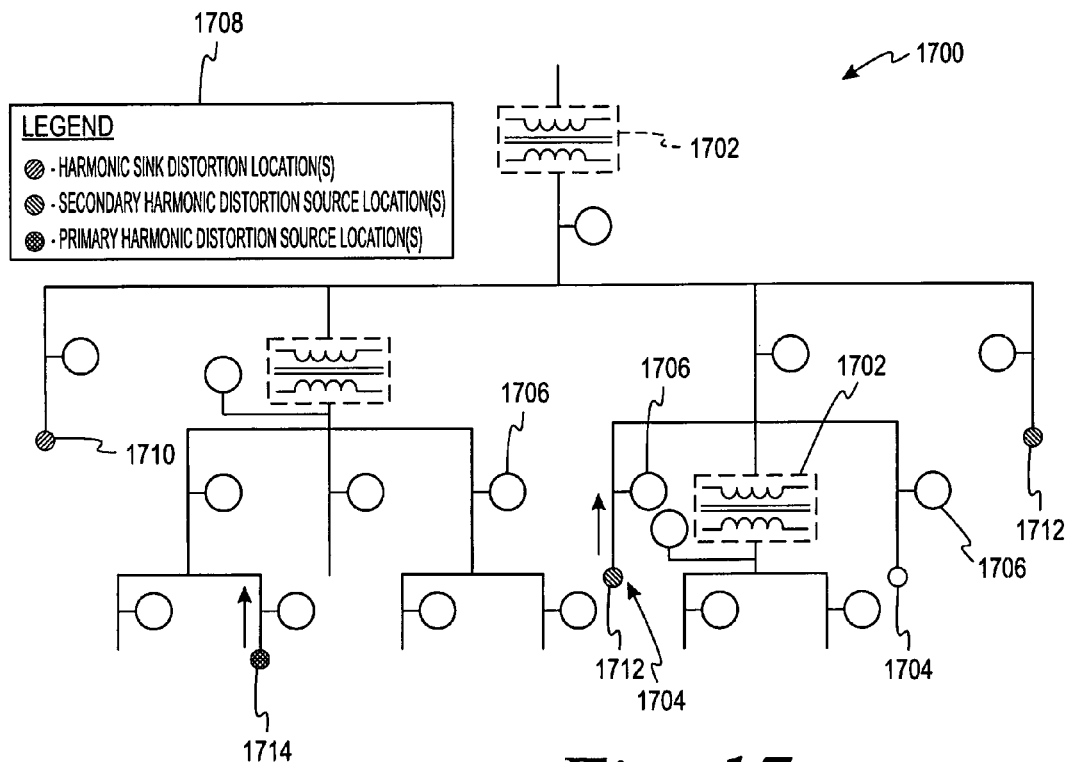
FIGS. 17a-17d are exemplary illustrations of the power monitoring system in FIG. 2 with various information ascertained by the algorithm in FIGS. 13a-13b interposed.

FIG. 17*a* is an exemplary graphic of a power monitoring system model 1700 showing the layout of the power monitoring system 120 in FIG. 2. In this example, the graphic 1700 contains a representation of the hierarchy of the utility system 102 including the location and interconnections between transformers 1702, load devices 1704, and meters 1706. A legend box 1708 is a key to graphic representations of different harmonic distortion source locations interposed on the utility system hierarchy of the power monitoring system model 1700 determined based on the harmonic distortion data collected by the monitoring devices in the power monitoring system 120. In this configuration, the user has configured the algorithm to output a representation of harmonic distortion sink locations 1710, secondary harmonic distortion source locations 1712 and a primary harmonic distortion source location 1714. Although, not shown, the harmonic distortion sink locations may be further designated as primary harmonic sinks and secondary harmonic sinks. The harmonic distortion sink locations may be determined based on the greatest magnitude of harmonic distortion current and voltage as well as the direction of harmonic components flowing toward a particular location in the hierarchy. The harmonic distortion sinks may also be determined based on specific harmonic frequency components. The secondary and primary harmonic distortion source locations may be determined based on comparison of the detected harmonic distortion characteristics and known historical data on harmonic component source locations. Alternatively, or in conjunction with the known data comparison, the characteristics may be compared with thresholds to classify primary and secondary sources. Alternatively, the algorithm can be configured to select the component with the largest magnitude as the primary source or sink all others as a secondary source or sink. The power system model of the location of the harmonic distortion sink and source locations 1712 and 1714 allows a user to determine possible locations for mitigation devices, possible placement of system components and other diagnostic or mitigation measures.

Figure 17B:
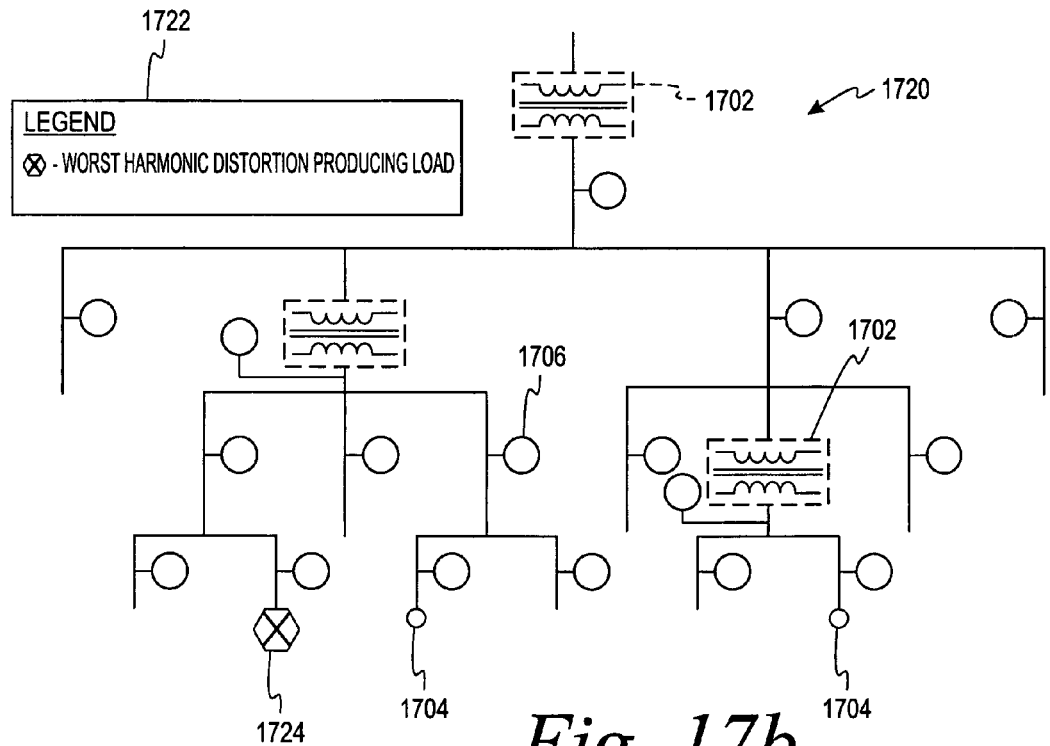

FIG. 17*b* is another example of a power system model 1720 of the utility system 102 in FIG. 2. The power system model 1720 includes a representation of the hierarchy of the power monitoring system 120 in FIG. 2 including the location and interconnections between the transformers 1702, load devices 1704, and meters 1706. A legend box 1722 is a key to representations of different harmonic distortion locations interposed on the utility system hierarchy of the power system model 1700 which shows a worst harmonic distortion producing load graphic 1724. The worst harmonic distortion producing load is determined by evaluating the data from all harmonic distortion sources found in the power monitoring system 120. The criteria may include any of the harmonics characteristics or data as explained above such as the greatest magnitude of current distortion, voltage distortion, power distortion, and/or distribution of destructive harmonic components, etc. The isolation of the worst harmonic distortion producing load enables a user to take either mitigation or elimination measures to solve problems resulting from harmonic distortion in the power monitoring system 120.

Figure 17C:
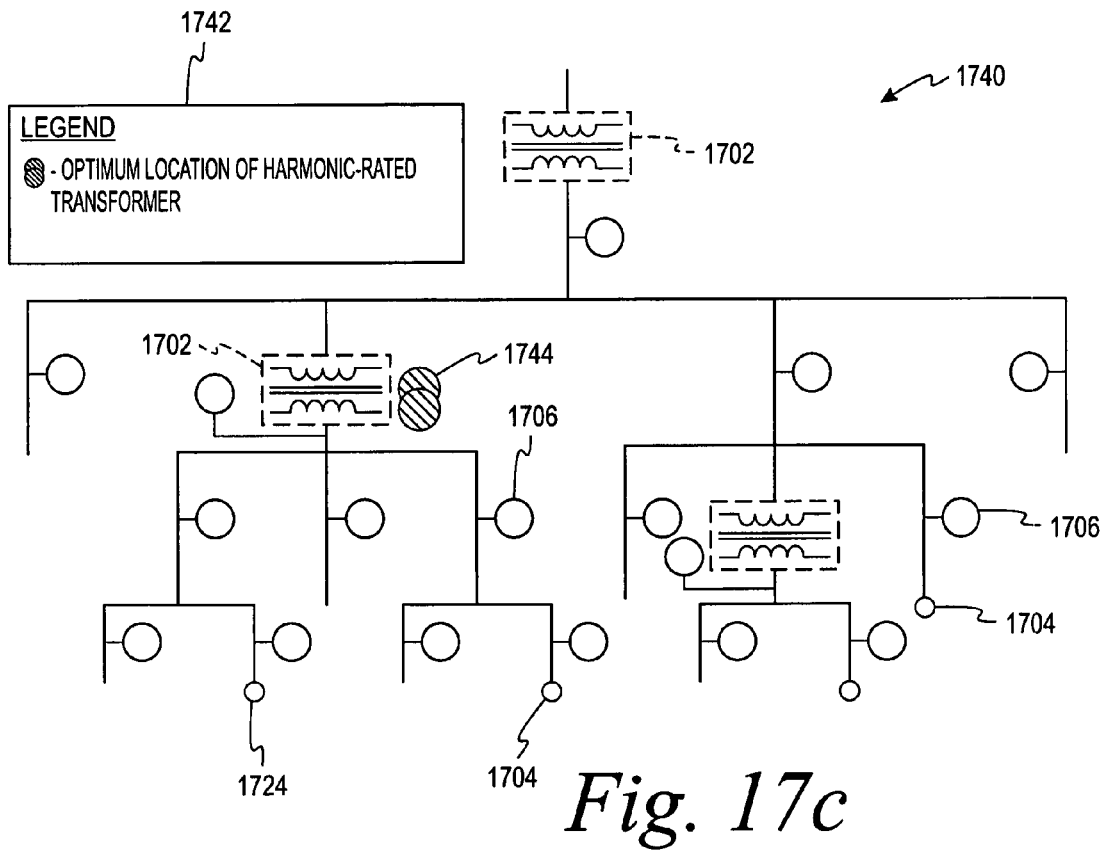

FIG. 17*c* is another example of a power system model 1740 of the power monitoring system 120 in FIG. 2. The power system model 1740 includes a representation of the hierarchy of the power monitoring system 120 including the location and interconnections of transformers 1702, load devices 1704, and meters 1706. The power system model 1740 includes the results of an analysis of a location for a harmonic-rated transformer to cope with the effects of harmonic distortion from harmonic-producing load 1724 determined previously as the worst harmonic distortion source and shown in FIG. 17*b*. A graphical representation of the power system model 1740 could be displayed on an interface. With such an interface a user may select an existing transformer via a touch screen or cursor-driven input device and request an analysis for a suggestion of whether or not a harmonic-rated transformer is required. The algorithm in FIGS. 13*a* and 13*b* may also access a subroutine for suggesting a mitigation method and equipment. In this example, a legend box 1742 is a key to graphic representations of an optimal location for a harmonic-rated transformer 1744 interposed on the utility system hierarchy of the graphic 1700. This solution provides suggested k-ratings for existing transformers 1702 based on the present and historical harmonic distortion characteristics. Harmonic-rated transformers will not protect components upstream or downstream from the harmonic distortion. Again, such a solution may is modify an existing transformer such as the transformer 1702 to perform the dual function of both harmonic distortion mitigation and rating for signals with high harmonic content.

Figure 17D:
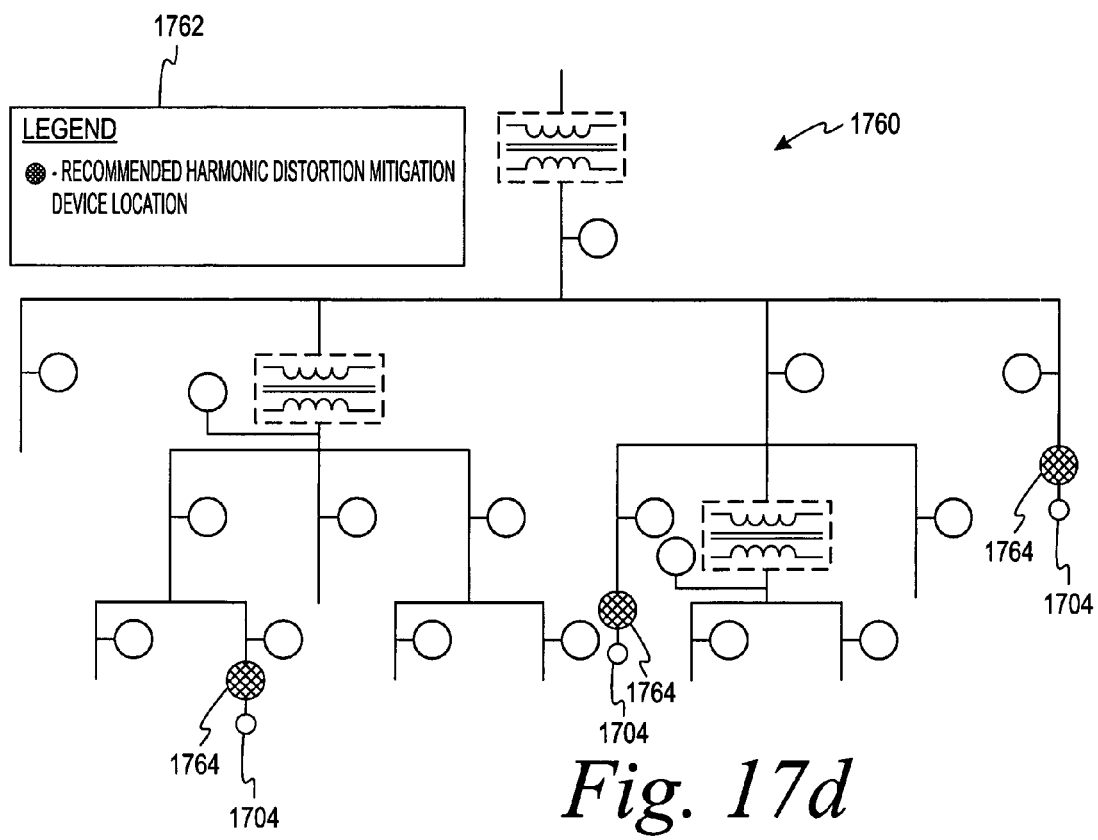

FIG. 17*d* is another example of a power system model 1760 of the power monitoring system 120 in FIG. 2. The power system model 1760 is the result of a user configuration to determine the location of specific mitigation devices such as filters to prevent damaging harmonic components from flowing upstream from harmonic distortion sources such as the loads 1704 identified in FIG. 17*a*. The algorithm in FIGS. 13*a* and 13*b* may access a subroutine for suggesting a mitigation method and equipment. In this example, a legend box 1762 is a key to graphic representations of optimal locations for source mitigation devices 1764 interposed on the utility system hierarchy of the graphic 1760. In this example, the subroutine has analyzed the locations and suggested mitigation devices in relation to the primary and secondary harmonic distortion sources shown in FIG. 17*a*.

An example specific utilization of the evaluation (1318) of FIG. 13*a* is found in the detection of the defective equipment which produces the voltage and current waveforms measured by a monitoring device as in FIGS. 14*a* and 15*a*. This is an example where equipment such as the rectifier may become damaged and still continue to operate under a stressed condition. If the end-user is unaware of this damage within his or her facility, then other equipment may become stressed as well resulting in the damage or catastrophic failure of other electrically adjacent pieces of equipment.

Figure 18:
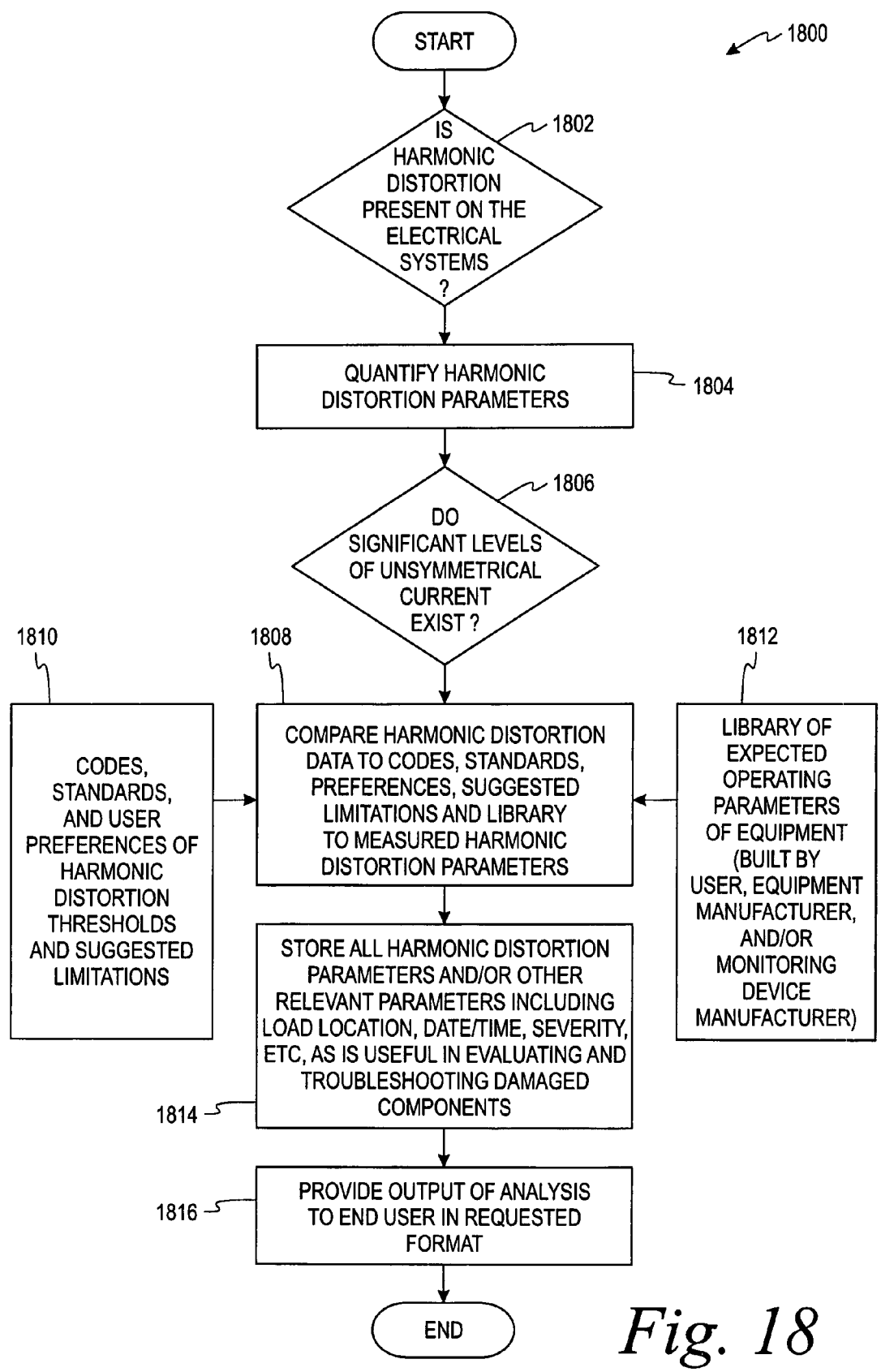
FIG. 18 is a flow diagram of a process to determine the cause of a harmonic distortion occurrence in the monitoring system in FIG. 2.

FIG. 18 is an example flow diagram 1800 for analyzing harmonic distortion to ascertain equipment damage, which may be the damaged rectifier producing the output waveforms shown in FIGS. 14*a* and 15*b*. The process shown in the flow diagram 1800 is a subset of (1318) of the flow diagram 1300 shown in FIGS. 13*a* and 13*b*. It is to be understood that the reporting and some data storage of the information evaluated and produced by the process would occur outside of the evaluation below. The subroutine in FIG. 18 is an example of an evaluation of an operating three-phase rectifier with a failed diode or SCR. The voltage and current signals of such a rectifier are graphically illustrated in FIGS. 14*a* and 15*a*. The subroutine in FIG. 18 determines whether harmonic components are present in the electrical system based on the gathered data from the monitoring devices in the system (1802). As explained above, the characteristics of discrete harmonic components are determined in this example by performing Fourier analysis of the detected current and voltage signals. The resulting current and voltage values (either magnitude or percentage) are compared to threshold values to determine the presence and magnitude of harmonic distortion components. If the data does not indicate the presence of harmonic distortion, the algorithm ends. If there are harmonic distortion components present on the system, the subroutine quantifies the harmonic distortion parameters from the Fourier analysis and other data such as total voltage and current harmonic distortion, discrete harmonic component magnitudes, angles, flow directions, etc. based on the measured data (1804). Based on the relevant characteristics such as unsymmetrical currents in this example, the subroutine determines whether defective equipment or discrete components exist (i.e., significant levels of unsymmetrical currents exist) (1806). If no relevant levels of unsymmetrical currents exist, the subroutine ends.

If relevant unsymmetrical currents exist (1806), the subroutine compares the applicable harmonic distortion data to codes, standards, suggested limitations and measured past harmonic distortion parameters relating to the cause(s) of unsymmetrical current flow (1808). In order to perform the different evaluation subroutines, the algorithm has access to a database 1810, which stores codes, standards and other user preferences relating both to expected operating parameters/characteristics of equipment as well as characteristics of damaged equipment. The subroutine also has access to configuration data such as location, evaluation periodicty, notification, alarming, zone setup, statitstics and trending reminders which are stored in a configuration file 1812. After the evaluation of harmonic distortion is completed the relevant data is stored for reporting, analysis and future reference (1814). Such data may then be reported for purposes such as alerting a user via the reporting block (1330) in FIGS. 13*a* and 13*b*. The output of the analysis is provided to the end user in the requested format (1816) and the subroutine ends.

Figure 19:
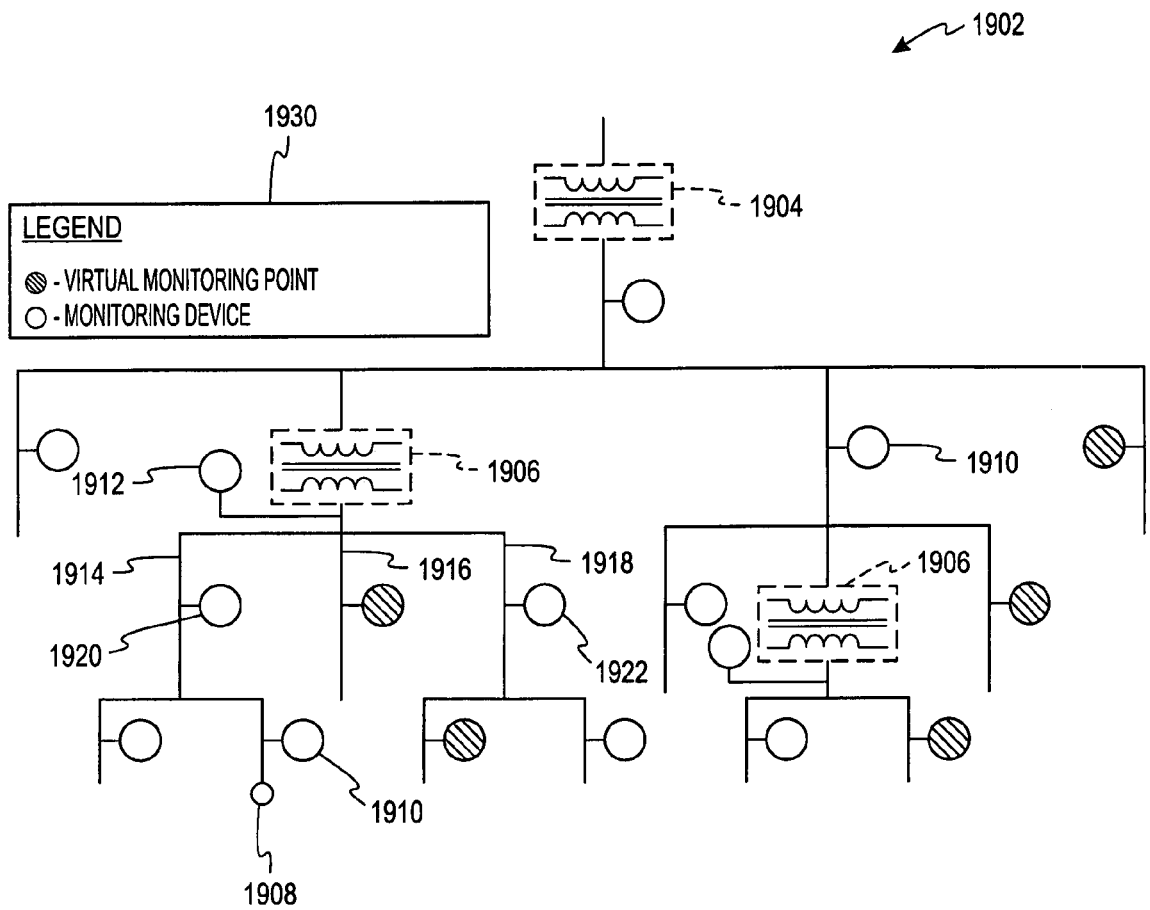
FIG. 19 is an exemplary illustration of this invention providing virtual metering capabilities in an electrical system.

Another application for determining system parameters such as harmonic distortion components may be seen in FIG. 19, which shows a modified utility layout 1902. The utility system shown by the utility layout 1902 employs a number of virtual monitoring points which are more cost effective because the number of actual monitoring devices is reduced. The utility system shown by the utility layout 1902 contains a main facility transformer 1904, and step-down transformers 1906, a variety of is loads such as a load 1908, and monitoring devices 1910. Although not shown for clarity, it is to be understood that the monitoring devices 1910 are in data communication with a central controller such as the computer 132 in FIG. 2. The hierarchy of the system as shown by the utility layout 1902 allows the user to determine data at virtual monitoring points by deriving it from the data of tangible monitoring devices. For example a monitoring device 1912 is located near the secondary of the transformer 1906. The power signals flow to three separate branches 1914, 1916 and 1918 from the output of transformer 1906. The monitoring device 1912 is thus located on a top level directly linked to a bottom or lower level which includes the three branches 1914, 1916, 1918. Of course it is to be understood that the top level associated with the monitoring device 1912 could be at a bottom or lower level relative to components further upstream such as the main facility transformer 1904. Two of the branches 1914 and 1918 have a monitoring device 1920 and 1922, respectively. It is required that the monitoring devices 1912, 1920 and 1922 are in both spatial and temporal or pseudo-temporal context. Because there is a direct link between the top level measured by the monitoring device 1912 and the bottom or lower level measured by the monitoring devices 1920 and 1922, by subtracting the known data components measured by the monitoring devices 1920 and 1922 from the total data measured by the monitoring device 1912, the system 120 may determine corresponding data for the virtual monitoring location on the third branch 1916. It is to be understood that the top level data may be used to determine the data for a virtual monitoring point representing a group of lower level branches rather than a single branch. In order to assist a user a legend graphic 1930 is used to show the location of other virtual monitoring points in the layout 1902.

Figure 20:
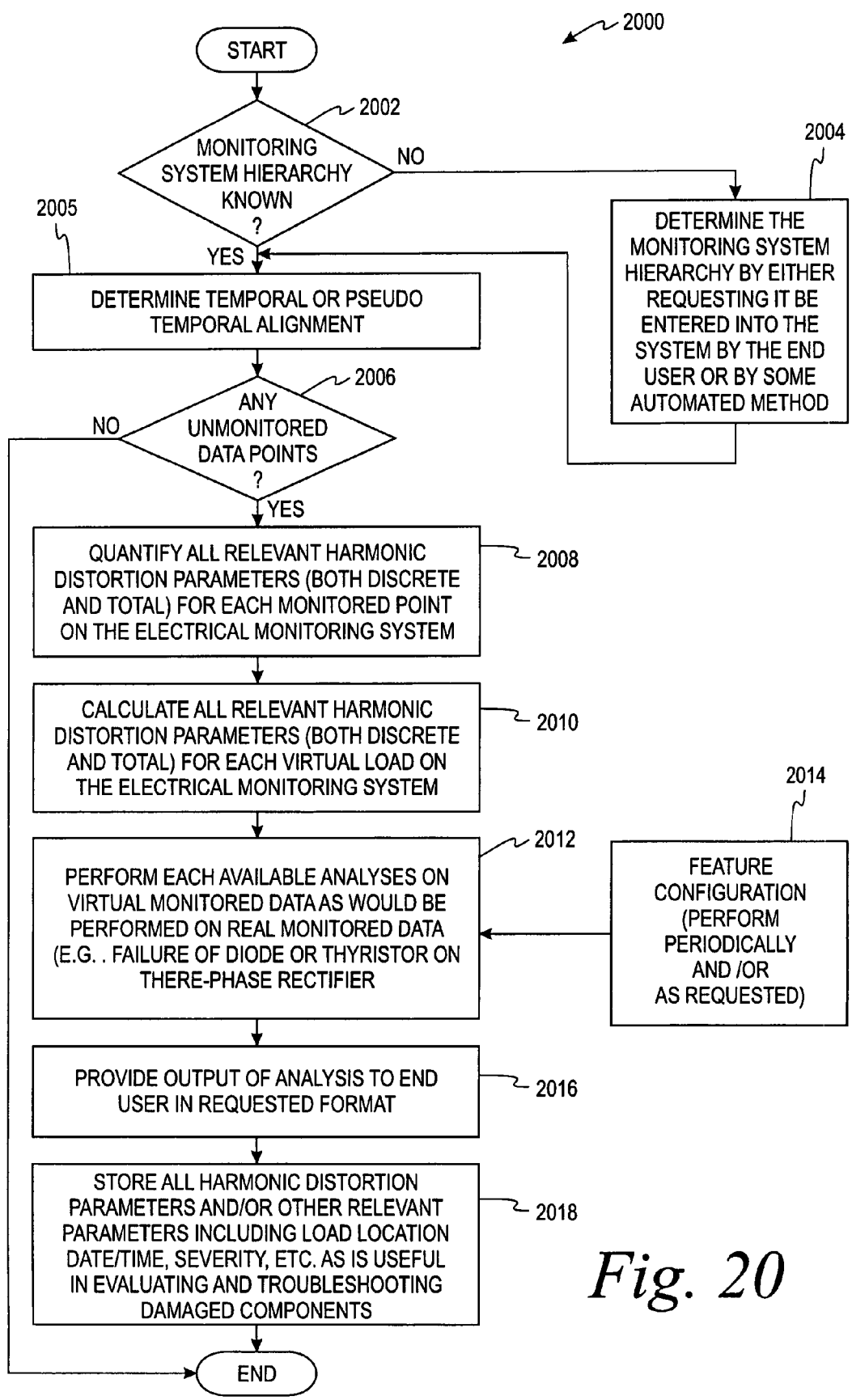
FIG. 20 is a flow diagram of a process to collect data using virtual metering such as shown in FIG. 19.

FIG. 20 shows a flow diagram 2000 of an algorithm to evaluate data from virtual monitoring points in conjunction with actual monitoring devices to assist the user to utilize all of the features which are described above such as harmonic distortion evaluation or other measurements and evaluations. Data provided by the virtual monitor points provide essentially the same data as any tangible monitoring device in a system such as the power monitoring system 120 in FIG. 2. The end-user may use the data from a virtual monitoring point for a variety of purposes (as they would any normal monitor) such as alarming, reporting, logging, etc. as explained above. Each virtual monitoring point in the layout 1902 is automatically determined by the algorithm described below and by data from the virtual monitoring points may be analyzed just as in tangible monitoring devices as will be explained below. As in the above process with all tangible monitoring devices, the data from the virtual monitoring points is also placed in spatial context and either temporal or pseudo-temporal context before performing the analysis.

The virtual monitoring points provide the end-user with the ability to view the changes in the total and discrete harmonic component magnitudes and directions throughout the entire monitored electrical power system, including the virtually monitored points. Due to the laws of conservation of energy, the total energy into an electrical system will equal the total energy used by the electrical system (stored, converted to another form of energy, and/or dissipated as losses). Using this concept, it is possible to determine both discrete and total harmonic distortion levels and directions from unmonitored points (i.e., virtual monitors). Despite the fact that monitoring devices are not installed at every possible point on the electrical system, the end-user may still obtain harmonic distortion data from levels without a tangible monitoring device. This allows the end-user to more effectively reduce energy costs as well as mitigate potential power quality concerns that could result in downtime and lost production, all for a reduced capital investment in a power monitoring system. The virtual monitoring points provide the end-user with aggregated harmonic distortion data that is governed by the principles of the laws of conservation of energy, the hierarchy of the monitored points on the monitoring system, and the actual data from each of the monitored points. The data from a virtual monitoring point may be provided to the end-user at a rate commensurate with their monitoring system's capabilities.

The flow diagram of an algorithm 2000 in FIG. 20 provides the general process for evaluating data relating to harmonic distortion from a utility system such as that represented by the layout 1902 in FIG. 19 which has virtual monitoring points in place of actual monitoring points. The algorithm 2000 determines whether the hierarchy of the electrical system such as the electrical system represented by the layout 1902 is known (2002). If the hierarchy is not known, the alogrithm determines whether the automated hierarchy algorithm such as that described above with reference to FIGS. 9, 10 and 11*a* is installed or requests a user supplied hierarchy (2004).

The algorithm 2000 places the data in the power monitoring system either in temporal or pseudo-temporal context (2005). Placing the data in temporal or pseudo-temporal context may be unnecessary if the data is already in temporal or pseudo-temporal context from the monitoring devices. After the hierarchy is determined and the data is temporally or pseudo-temporally aligned, the algorithm 2000 determines whether there are any unmonitored data points (2006). If there are no unmonitored data points, the algorithm ends. If there are unmonitored data points, indicating the need to evaluate virtual monitoring points, the algorithm 2000 sends commands to all monitoring devices in the system to measure electrical data relating to harmonic distortion (2008). After the monitoring devices have measured the electrical data, the virtual monitor data is quantified and evaluated with regard to the source of the data in relation to the monitoring devices (2010). The algorithm 2000 calculates the relevant harmonic distortion parameters for each virtual monitoring point on the system based on the measurements of the data from each capable monitoring device on the power monitoring system and the data taken from the tangible monitoring devices themselves (2012). The algorithm 2000 performs evaluation subroutines as explained above based on the monitoring device data and the virtual monitoring device data derived from the tangible monitoring device data. The algorithm 2000 accesses a database such as the database 1320 in FIGS. 13a-13b, which stores codes, standards and other user preferences and a configuration file such as the configuration file 1322 storing configuration data such as location, evaluation periodicty, notification, alarming, zone setup, statitstics and trending reminders (2014). After the evaluation of harmonic distortion is completed the algorithm outputs the data to the user according to a user defined configuration such as a graphic or textual data (2016), or an alarm. The relevant data is also stored for reporting, analysis and future reference (2018).

Figure 21:
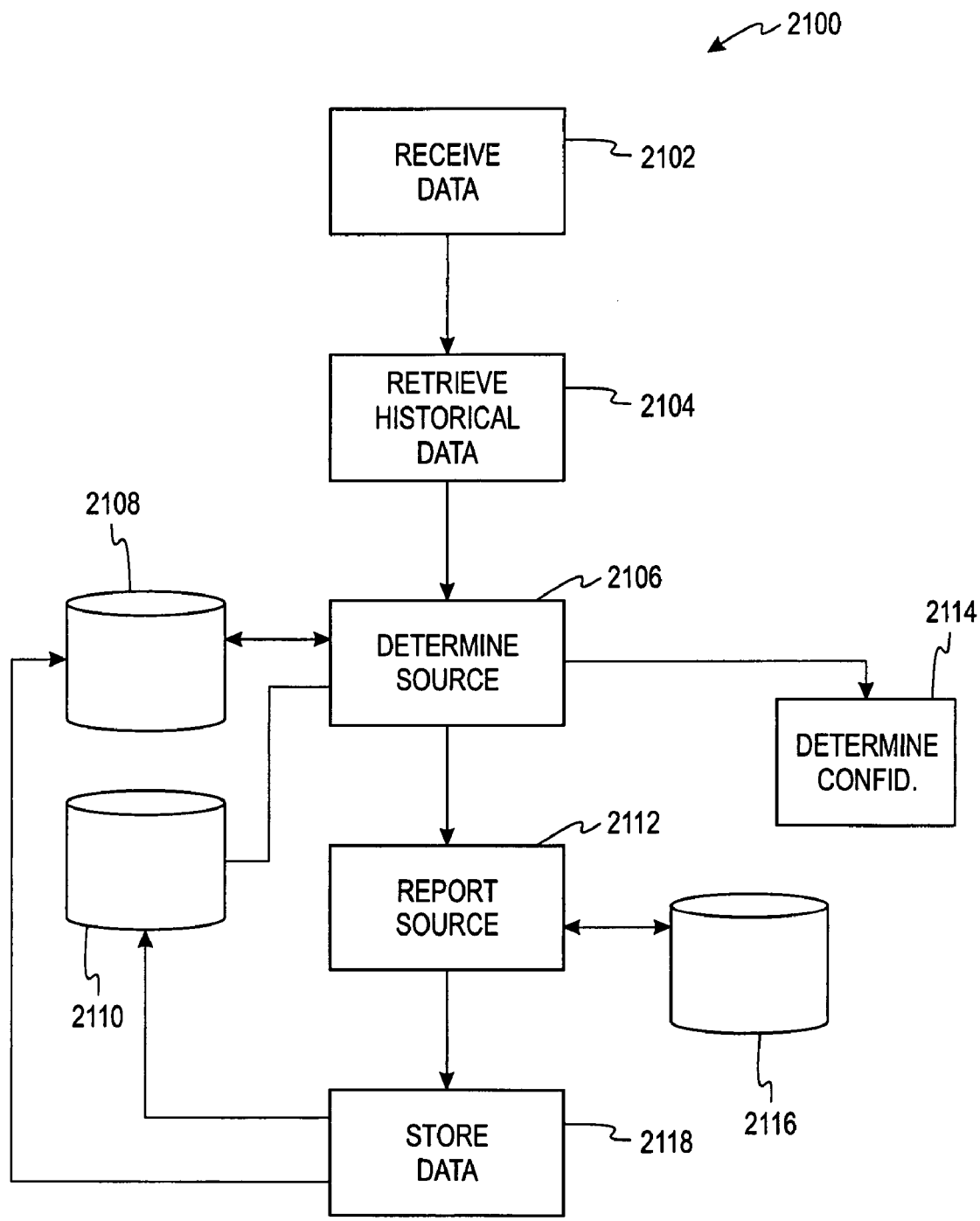
FIG. 21 is a flow diagram of a process to identify the source of harmonic distortion in an electrical system.

FIG. 21 illustrates a flow chart of an algorithm 2100 that determines the source of detected harmonic distortion. This algorithm 2100 is a subset of step 1318 of the flow diagram 1300 shown in FIGS. 13a-13b. The algorithm 2100 first receives harmonic distortion data from the algorithm 1300 in FIGS. 13a-13b for a detected harmonic distortion event (2102). The user may be presented with an option to view information about particular historical harmonic distortion characteristics in addition to the currently detected harmonic components and harmonic distortion (2104). The harmonic components selected by the user are evaluated and a harmonic distortion source is determined against a list of known and expected characteristics of various sources of harmonic distortion (2106). Conventional statistical correlation, histogram, and simple comparison methods may be employed to determine which harmonic distortion source type best correlates with the information from the selected harmonic distortion components and/or characteristics. For example, a user may request that the computer 132 determine the source of harmonic distortion that occurred recently. The user selects the harmonic distortion source and the algorithm 2100 determines, through statistical correlation, and the like, which source most likely corresponds to the selected harmonic distortion characteristics based on factors such as occurrence time, duration, severity, phase, frequency, etc. The algorithm 2100 draws upon a database 2108 of stored historical information and a library 2110 of known characteristics and/or expected characteristics for various harmonic distortion sources. Historical information concerning this harmonic distortion pattern and the likely source as well as other similar historical information is stored in the database 2108. The library 2110 may be supplemented by user, manufacturer, or other database information containing harmonic distortion source characteristics. A threshold confidence level can be programmed into the algorithm 2100 or selected by the user to set the level of correlation desired. Once the source of the harmonic distortion is determined, the source or probable source may be reported to the user (2112). Such reporting may be shown graphically and/or in a textual format.

In still another example, the user may request information about a range of historical harmonic distortion data (2104), and the algorithm 2100 determines whether a single source may be causing the harmonic distortion. To do so, the algorithm 2100 consults the stored historical information 2110 and the library of known and/or expected harmonic distortion source type characteristics, and through statistical correlation, histogram algorithms, simple comparisons, or the like, determines, to a certain degree of confidence, that the harmonic distortion is or is not likely caused by a single source.

When a harmonic distortion event is detected by a monitoring device, the algorithm 2100 evaluates the data derived from the harmonic distortion and determines, according to the methods described above, the source of the harmonic distortion against a list of known and expected characteristics of various harmonic distortion sources (2106). For example, one source might be a rectifier-based device, and known characteristics describing this source may be stored in the library 2110. Additionally, expected characteristics of these harmonic distortion sources may be stored in the library 2110. Historical information concerning other harmonic distortion events with other causes is stored in the database 2108. When harmonic distortion is detected by the monitoring device, it is characterized and those characteristics are compared against the known and expected harmonic distortion sources. When a strong correlation with a particular source is found, the algorithm 2100 reports that the harmonic distortion source is likely that source (2108). Optionally, the algorithm 2100 can also report its confidence expressed, for example, as a numerical percentage of certainty, or as an expression of degree of certainty such as high or low confidence (2114). The manner of reporting and criteria to be used in reporting the results to the user can be user-defined, default, or predefined in accordance with a reporting configuration database 2116. The information as to the harmonic distortion source is presented to the user according to the reporting configuration information stored in the database 2116 or other data in memory. The data may be stored in any storage device including for example a database, the memory in the computer 132, the monitoring devices, or combinations of storage devices.

The algorithm 2100 stores the relevant data from the detected harmonic distortion for reporting, analysis, and future reference (2118). That data includes the characteristics associated with the harmonic distortion, the source of the harmonic distortion, the confidence level in the identification of the harmonic distortion source, and any updates or changes to the database 2108, library 2110, or reporting configuration database 2116.

Figure 22A:
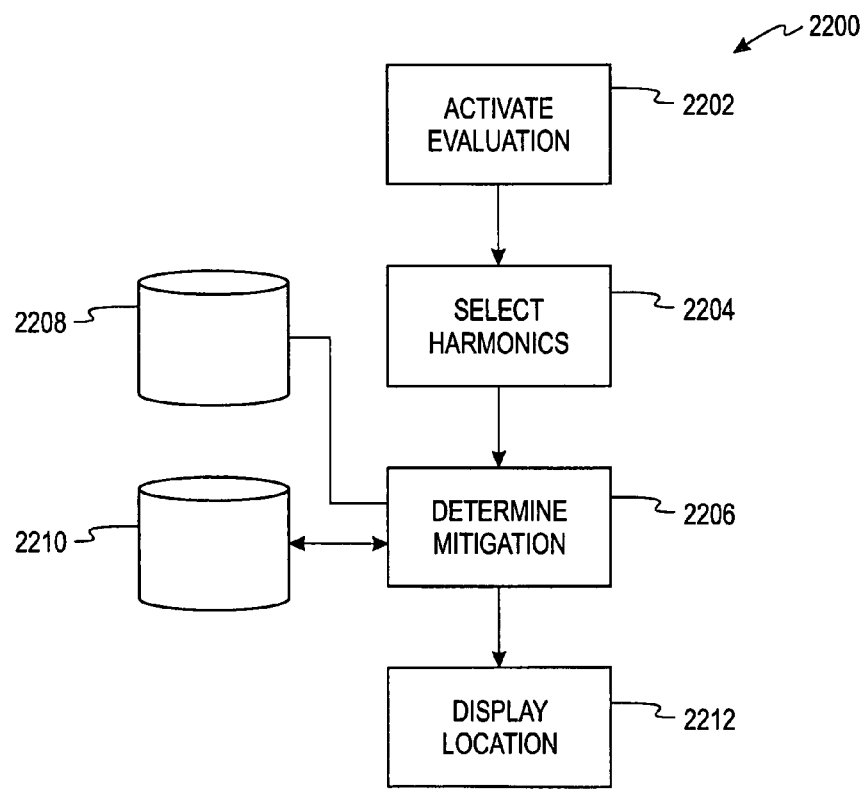
FIG. 22a is a flow diagram of a process for determination of optimal harmonic distortion mitigation devices in an electrical system.

FIG. 22a is a flow chart of a mitigation determination algorithm 2200 that determines the best mitigation technique for suppressing, reducing, or eliminating the effects of harmonic distortion. This algorithm 2200 is a subset of step 1318 of the flow diagram 1300 shown in FIGS. 13a-13b. The user indicates a desire for information on potential improvements by harmonic distortion mitigation devices to activate the algorithm (2202). The user selects a detected harmonic distortion signal, or a particular harmonic distortion source for application of mitigation devices (2204). The harmonic distortion may be based on current harmonic distortion levels and components or some subset of historically recorded harmonic distortion measurements. The algorithm 2200 evaluates the characteristics of the harmonic distortion selected by the user from the data derived from the algorithm 1300 in FIGS. 13a-13b to determine the best mitigation techniques to be implemented (2206). To do so, the algorithm 2200 draws upon stored historical information in a database 2208 and a library 2210 of mitigation techniques and applications for a given set of harmonic distortion types or harmonic distortion sources. This library 2210 may be supplemented by user, manufacturer, or other database information containing mitigation techniques and applications. For example, for a selected combination of harmonic distortion characteristics, the library 2210 may suggest, based on the historical information database 2208, that a harmonic distortion mitigation device may be installed on or near a piece of equipment that is the likely harmonic distortion source. In other circumstances, the library 2210 may suggest the application of a transformer further upstream. Information like this is provided to the user according to user-defined, default, or predefined configuration information for reporting and according to the criteria to be used for such reporting. For example, the user can be presented with a graphical layout of the power system, along with a graphical representation of the mitigation device over the location on the layout where it should be installed which impart the information shown in the power system models 1740 and 1760 in FIGS. 17c-17d above (2212). The computer 132 can then determine how effective the mitigation device was and data representing its effectiveness or non-effectiveness may be accumulated in the historical database 2208 relating to the performance of different mitigation devices. This aspect is described in more detail in FIG. 22b.

If the monitoring device detects a harmonic distortion event (2202), the algorithm 2200 evaluates the characteristics of the harmonic distortion event and determines the best mitigation technique(s) to be implemented (2206). Here, the algorithm 2200 draws upon the same database 2208 and library 2110 to correlate the data relating to the detected harmonic distortion with known or historical data and the corresponding mitigation techniques that can effectively reduce or eliminate the effect of that particular harmonic distortion source or component.

Figure 22B:
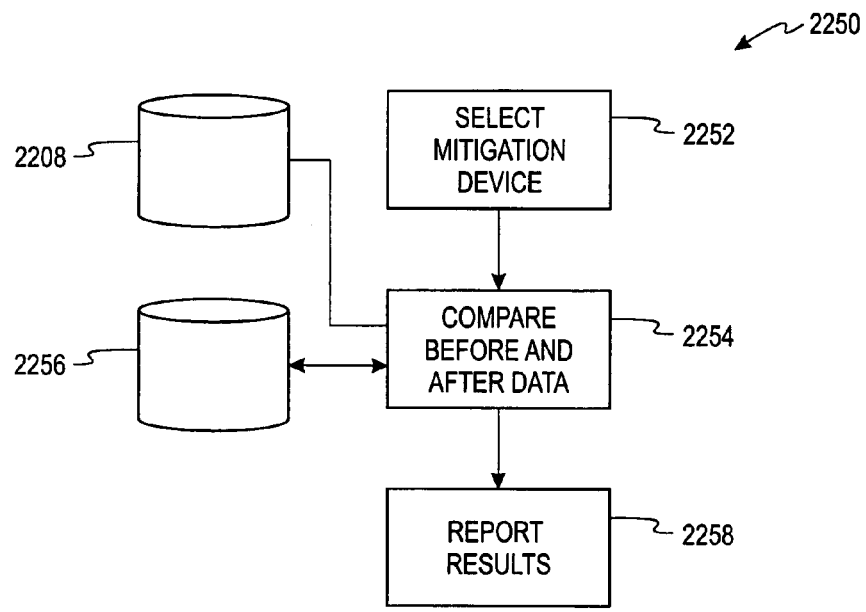
FIG. 22b is a flow diagram of a process to determine the effectiveness of a proposed or installed harmonic distortion mitigation device.

FIG. 22b is a flow chart of a mitigation effectiveness algorithm 2250 that determines how effective a suggested installed mitigation device was on reducing or eliminating the harmonic distortion caused by a harmonic distortion source. The algorithm 2250 queries whether the user wants information on whether a particular mitigation device improved the system's response to a harmonic distortion event (2252). The algorithm 2250 evaluates the history of a harmonic distortion event to determine improvements to the power system using statistical analysis, histograms, or simple comparison techniques (2254). To do so, the algorithm 2250 consults the database 2208 of stored historical information (concerning harmonic distortion events and their corresponding characteristics) and a database 2256 of customer-supplied information on the date of installation, type, location, and other pertinent information as required regarding the mitigation equipment that was installed. For example, the algorithm 2250 makes a determination that a mitigation device caused an overall improvement when a comparison of the historical effects of a harmonic distortion are improved compared to those effects after the mitigation device was installed. A threshold can be set by the user or automatically set to quantify the level of improvement necessary before an overall improvement is reported to the user. The resulting comparison is reported to a user (2258). The form of the reporting may include a graphical or numerical analysis of the harmonic distortion data before and after the mitigation device was installed. Additionally, a return on investment (ROI) for the mitigation device that was installed may be determined based upon the cost of the mitigation device, its date of installation, and the aggregate savings in downtime, capital expenses, and other expenses related to the non-mitigated system.

Thus, the above-described harmonic distortion analysis software and subroutines are designed to assist the user in determining an electrical system's past and future operating characteristics based on a combination of configurations and/or loads. The software determines and responds to real-time (present) operating characteristics as they relate to harmonic distortion on an existing electrical system. Loads continuously fluctuate and the system impedance is always changing due to the inherent dynamic nature of most facilities energy usage patterns. In some instances, time is of the essence since equipment could be damaged, perhaps catastrophically. In other instances, it is imperative to view changes in the harmonic distortion characteristics (as they change with the system's operating characteristics) over extremely small increments of time so that the full breadth of the harmonic distortion's impact can be accurately quantified.

The above-described algorithms for harmonic distortion detection result in simpler analysis of harmonic distortion issues reducing the complexity of end-user setup and/or required knowledge. Because instantaneous reporting of a harmonic distortion problem may be achieved with the spatial and temporal (or pseudo-temporal) context of the harmonic distortion data, when equipment is damaged, the system can inform a user immediately and accurately report the likely location of the problem. Quicker analysis and notification of harmonic distortion issues results in a reduction of the severity and number of potential equipment damage and/or failures. Easier troubleshooting of harmonic distortion issues allowing the user to more quickly locate and quantify harmonic distortion "hot spots" that might otherwise go unnoticed until equipment damage or failure occurs. More cost effective analysis of harmonic distortion issues saves the end-user money in consulting services and fees. Downtime due to harmonic distortion related issues is reduced. The harmonic distortion monitoring system may also redundantly verify harmonic power flows within the monitored electrical system and to/from the utility. The harmonic distortion monitoring system also continuously evaluates sudden changes with loads on the system or a customer changing an electrical configuration that suddenly creates harmonic distortion.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method of harmonic distortion monitoring in an electrical power system that includes a plurality of monitoring devices, comprising:

receiving a representation of a hierarchy of the electrical power system, the hierarchy indicating how the plurality of monitoring devices are linked together in the electrical power system;

receiving data, which is indicative of respective current or voltage signals measured by at least two of the plurality of monitoring devices, from the at least two monitoring devices;

automatically temporally or pseudo-temporally aligning the data received from the at least two monitoring devices to produce synchronized data, by causing the data received from the at least two monitoring devices to be synchronized to a zero-crossing of the respective current or voltage signals measured by the at least two monitoring devices;

responsive to the automatically aligning, receiving harmonic distortion data indicative of harmonic distortion on the electrical power system from the at least two monitoring devices;

determining an electrical characteristic of the harmonic distortion from the harmonic distortion data; and analyzing the electrical characteristic of the harmonic distortion to determine a location of a harmonic distortion source or a harmonic distortion sink in the electrical power system based on at least the representation of the hierarchy and on the synchronized data.

2. The method of claim 1, wherein the electrical characteristics of the harmonic distortion include 1) total voltage harmonic distortion; 2) total current harmonic distortion; 3) discrete harmonic distortion component magnitudes and angles (voltages, currents, and powers); 4) discrete harmonic distortion component flow directions; 5) discrete interharmonic distortion component magnitudes (voltages, currents, and powers); 6) discrete interharmonic distortion component flow directions; 7) affected phase(s) (A,B,C); 8) total even harmonic distortion and total odd harmonic distortion; 9) triplens; 10) harmonic distortion associated with three-phase rectifiers; 11) harmonic distortion associated with positive sequence components; 12) harmonic distortion associated with negative sequence components; 13) harmonic distortion associated with zero-sequence components; 14) true power factor versus displacement power factor; 15) crest factors; 16) total demand distortion; or 17) neutral current flows.

3. The method of claim 1, wherein the determining the electrical characteristic of the harmonic distortion includes comparing the aligned data received from one of the at least two monitoring devices with a threshold value to determine whether the aligned data received from one of the at least two monitoring devices represents a harmonic distortion signal.

4. A method of claim 1, further comprising determining potential sources for harmonic distortion in the electrical power system based on the determined electrical characteristic of the harmonic distortion.

5. The method of claim 4, further comprising classifying at least one of the potential sources for harmonic distortion based on the determined electrical characteristic of the harmonic distortion.

6. The method of claim 1, further comprising analyzing the electrical characteristic of the harmonic distortion to determine an optimal location for a harmonic distortion mitigation device in the electrical power system.

7. The method of claim 1, further comprising determining the effects of mitigation devices on harmonic distortion in the electrical power system.

8. The method of claim 1, wherein the monitoring devices include a top level monitoring device on a circuit of the electrical power system and at least one lower level monitoring device on a subcircuit directly linked to the circuit, wherein the data is sensed from at least one virtual monitoring point derived from the data received from the top level monitoring device and the at least one lower level monitoring device.

9. The method of claim 1, wherein the data received from the at least two monitoring devices is synchronized to the zero-crossing of the respective current or voltage signals measured by the at least two monitoring devices.

10. A system to monitor harmonic distortion in an electrical power system, comprising:
a plurality of monitoring devices in the electrical power system;
a central controller coupled to the plurality of monitoring devices; and
a computer readable medium encoded with instructions executed by the central controller for directing the central controller to:
receive a representation of a hierarchy of the electrical power system, the hierarchy indicating how the plurality of monitoring devices are linked together in the electrical power system;
receive data, which is indicative of respective current or voltage signals measured by at least two of the plurality of monitoring devices, from the at least two monitoring devices; and
automatically temporally or pseudo-temporally align the data received from the at least two monitoring devices to produce synchronized data, by causing the data received from the at least two monitoring devices to be synchronized to a zero-crossing of the respective current or voltage signals measured by the at least two monitoring devices;
responsive to the automatically aligning, receive harmonic distortion data indicative of harmonic distortion on the electrical power system from the at least two monitoring devices;
determine an electrical characteristic of harmonic distortion from the harmonic distortion data; and
analyze the electrical characteristic of the harmonic distortion to determine a location of a harmonic distortion source or a harmonic distortion sink in the electrical power system based on at least the representation of the hierarchy and on the harmonic distortion data.

11. The system of claim 10, wherein the harmonic distortion characteristics include 1) total voltage harmonic distortion; 2) total current harmonic distortion; 3) discrete harmonic distortion component magnitudes and angles (voltages, currents, and powers); 4) discrete harmonic distortion component flow directions; 5) discrete interharmonic distortion component magnitudes (voltages, currents, and powers); 6) discrete interharmonic distortion component flow directions; 7) affected phase(s) (A,B,C); 8) total even harmonic distortion and total odd harmonic distortion; 9) triplens; 10) harmonic distortion associated with three-phase rectifiers; 11) harmonic distortion associated with positive sequence components; 12) harmonic distortion associated with negative sequence components; 13) harmonic distortion associated with zero-sequence components; 14) true power factor versus displacement power factor; 15) crest factors; 16) total demand distortion; or 17) neutral current flows.

12. The system of claim 10, wherein the computer readable medium is further encoded with instructions for directing the central controller to determine potential sources for harmonic distortion in the electrical power system based on the determined electrical characteristic of the harmonic distortion.

13. The system of claim 10, wherein the computer readable medium is further encoded with instructions for directing the central controller to classify at least one of the potential sources for harmonic distortion based on the determined electrical characteristic of the harmonic distortion.

14. The system of claim 10, wherein the computer readable medium is further encoded with instructions for directing the central controller to analyze the harmonic distortion characteristics to determine a location of a harmonic distortion source or a harmonic distortion sink.

15. The system of claim 10, further comprising a mitigation evaluation module analyzing the electrical characteristic of the harmonic distortion to determine an optimal location for a harmonic distortion mitigation device in the electrical power system.

16. The system of claim 10, wherein the monitoring devices include a top level monitoring device on a circuit of the electrical power system and at least one lower level monitoring device on a subcircuit directly linked to the circuit, wherein the central controller determines the data via at least one virtual monitoring point derived from the data received from the top level monitoring device and the at least one lower level monitoring device.

17. A method of determining harmonic distortion on an electrical power system including a plurality of monitoring devices, the method comprising:

receiving a representation of a hierarchy of the electrical power system, the hierarchy indicating how the plurality of monitoring devices are linked together in the electrical power system;

receiving data, which is indicative of respective current or voltage signals measured by at least two of the plurality of monitoring devices, from the at least two monitoring devices;

automatically temporally or pseudo-temporally aligning the data received from the at least two monitoring devices to produce synchronized data, by causing the data received from the at least two monitoring devices to be synchronized to a zero-crossing of the respective current or voltage signals measured by the at least two monitoring devices;

determining an electrical characteristic of harmonic distortion from the synchronized data;

analyzing the electrical characteristic of the harmonic distortion to determine a location of a harmonic distortion source or a harmonic distortion sink in the electrical power system based on at least the representation of the hierarchy and on the synchronized data.

18. The method of claim 17, wherein the analyzing is performed via Fourier analysis to produce analyzed data indicative of harmonic distortion, the method further comprising confirming the presence of harmonic distortion in the electrical power system by comparing the analyzed data to a threshold value.

* * * * *